(12) United States Patent
Takemura et al.

(10) Patent No.: US 7,863,619 B2
(45) Date of Patent: Jan. 4, 2011

(54) SEMICONDUCTOR DEVICE AND A METHOD FOR MANUFACTURING THE SAME

(75) Inventors: Yasuhiko Takemura, Kanagawa (JP); Satoshi Teramoto, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/427,139

(22) Filed: Apr. 21, 2009

(65) Prior Publication Data

US 2009/0200611 A1    Aug. 13, 2009

Related U.S. Application Data

(60) Continuation of application No. 11/979,127, filed on Oct. 31, 2007, now Pat. No. 7,615,786, and a continuation of application No. 11/634,904, filed on Dec. 7, 2006, now Pat. No. 7,301,209, and a division of application No. 10/935,177, filed on Sep. 8, 2004, now Pat. No. 7,170,138, and a division of application No. 10/028,269, filed on Dec. 28, 2001, now Pat. No. 6,835,607, and a division of application No. 09/311,067, filed on May 13, 1999, now Pat. No. 6,335,555, and a division of application No. 08/966,975, filed on Nov. 10, 1997, now Pat. No. 5,945,711, and a division of application No. 08/313,910, filed on Sep. 28, 1994, now Pat. No. 5,719,065.

(30) Foreign Application Priority Data

Oct. 1, 1993    (JP) ..................................... 5-269780
Jul. 21, 1994    (JP) ..................................... 6-191020

(51) Int. Cl.
H01L 29/10    (2006.01)

(52) U.S. Cl. .............................. 257/66; 257/71; 257/72; 257/E29.273; 257/E29.276

(58) Field of Classification Search .................. 257/66, 257/71, 72, E29.273, E29.276
See application file for complete search history.

(56) References Cited

U.S. PATENT DOCUMENTS 3,597,667 A    8/1971    Horn (Continued)

FOREIGN PATENT DOCUMENTS

EP    0 556 484    8/1993

(Continued)

OTHER PUBLICATIONS

Bonnel et al., "Si Poly TFT's with Low Off-Current for Flat Panel Displays," pp. 199-202, 1993, Euro Display '93.

(Continued)

*Primary Examiner*—Zandra Smith
*Assistant Examiner*—Paul E Patton
(74) *Attorney, Agent, or Firm*—Eric J. Robinson; Robinson Intellectual Property Law Office, P.C.

(57) ABSTRACT

A thin film transistor of the present invention has an active layer including at least source, drain and channel regions formed on an insulating surface. A high resistivity region is formed between the channel region and each of the source and drain regions. A film capable of trapping positive charges therein is provided on at least the high resistivity region so that N-type conductivity is induced in the high resistivity region. Accordingly, the reliability of N-channel type TFT against hot electrons can be improved.

28 Claims, 12 Drawing Sheets

U.S. PATENT DOCUMENTS

| | | |
|---|---|---|
| 3,964,941 A | 6/1976 | Wang |
| 4,217,153 A | 8/1980 | Fukunaga et al. |
| 4,313,782 A | 2/1982 | Sokoloski |
| 4,342,617 A | 8/1982 | Fu et al. |
| 4,347,586 A | 8/1982 | Natsui |
| 4,409,724 A | 10/1983 | Tasch, Jr. |
| 4,447,272 A | 5/1984 | Saks |
| 4,468,855 A | 9/1984 | Sasaki |
| 4,477,310 A | 10/1984 | Park et al. |
| 4,566,175 A | 1/1986 | Smayling |
| 4,583,122 A | 4/1986 | Ohwada et al. |
| 4,625,224 A | 11/1986 | Nakagawa et al. |
| 4,651,406 A | 3/1987 | Shimizu |
| 4,665,419 A | 5/1987 | Sasaki |
| 4,717,681 A | 1/1988 | Curran |
| 4,733,947 A | 3/1988 | Ota et al. |
| 4,746,628 A | 5/1988 | Takafuji et al. |
| 4,753,896 A | 6/1988 | Matloubian |
| 4,768,076 A | 8/1988 | Aoki et al. |
| 4,782,037 A | 11/1988 | Tomozawa et al. |
| 4,786,955 A | 11/1988 | Plus et al. |
| 4,808,845 A | 2/1989 | Suzuki |
| 4,810,673 A | 3/1989 | Freeman |
| 4,822,752 A | 4/1989 | Sugahara et al. |
| 4,823,180 A | 4/1989 | Wieder |
| 4,851,363 A | 7/1989 | Troxell et al. |
| 4,851,370 A | 7/1989 | Doklan |
| 4,857,986 A | 8/1989 | Kinugawa |
| 4,876,582 A | 10/1989 | Janning |
| 4,886,962 A | 12/1989 | Gofuku |
| 4,899,202 A | 2/1990 | Blake et al. |
| 4,933,298 A | 6/1990 | Hasegawa |
| 4,937,645 A | 6/1990 | Ootsuka et al. |
| 4,943,837 A | 7/1990 | Konishi et al. |
| 4,951,100 A | 8/1990 | Parrillo |
| 5,040,037 A | 8/1991 | Yamaguchi et al. |
| 5,055,906 A | 10/1991 | Mase et al. |
| 5,063,378 A | 11/1991 | Roach |
| 5,079,617 A | 1/1992 | Yoneda |
| RE33,829 E | 2/1992 | Castleberry |
| 5,102,813 A | 4/1992 | Kobayashi |
| 5,112,764 A | 5/1992 | Mitra et al. |
| 5,113,511 A | 5/1992 | Nelson |
| 5,130,770 A | 7/1992 | Blanc et al. |
| 5,130,772 A | 7/1992 | Choi |
| 5,142,344 A | 8/1992 | Yamazaki |
| 5,153,685 A | 10/1992 | Murata et al. |
| 5,169,792 A | 12/1992 | Katoh |
| 5,182,620 A | 1/1993 | Shimada et al. |
| 5,188,976 A | 2/1993 | Kume et al. |
| 5,191,373 A | 3/1993 | Nakano |
| 5,198,685 A | 3/1993 | Kitani et al. |
| 5,208,476 A | 5/1993 | Inoue |
| 5,212,119 A | 5/1993 | Hah |
| 5,215,931 A | 6/1993 | Houston |
| 5,243,213 A | 9/1993 | Miyazawa et al. |
| 5,247,289 A | 9/1993 | Matsueda |
| 5,254,208 A | 10/1993 | Zhang |
| 5,258,323 A | 11/1993 | Sarma et al. |
| 5,292,675 A | 3/1994 | Codama |
| 5,292,677 A | 3/1994 | Dennison |
| 5,306,651 A | 4/1994 | Masumo |
| 5,308,998 A | 5/1994 | Yamazaki |
| 5,313,075 A | 5/1994 | Zhang et al. |
| 5,313,076 A | 5/1994 | Yamazaki et al. |
| 5,317,236 A | 5/1994 | Zavracky et al. |
| 5,324,974 A | 6/1994 | Liao |
| 5,341,028 A | 8/1994 | Yamaguchi et al. |
| 5,343,066 A | 8/1994 | Okamoto |
| 5,352,631 A * | 10/1994 | Sitaram et al. ............ 438/300 |
| 5,355,022 A | 10/1994 | Sugahara et al. |
| 5,359,206 A | 10/1994 | Yamamoto |
| 5,365,079 A | 11/1994 | Kodaira |
| 5,371,037 A | 12/1994 | Yonehara |
| 5,374,564 A | 12/1994 | Bruel |
| 5,387,555 A | 2/1995 | Linn et al. |
| 5,403,759 A | 4/1995 | Havemann |
| 5,410,172 A | 4/1995 | Koizumi et al. |
| 5,414,278 A | 5/1995 | Kobayashi et al. |
| 5,414,442 A | 5/1995 | Yamazaki et al. |
| 5,424,230 A | 6/1995 | Wakai |
| 5,424,752 A | 6/1995 | Yamazaki et al. |
| 5,426,062 A | 6/1995 | Hwang |
| 5,426,315 A | 6/1995 | Pfiester |
| 5,440,163 A | 8/1995 | Ohhashi |
| 5,444,282 A | 8/1995 | Yamaguchi et al. |
| 5,444,457 A | 8/1995 | Hotto |
| 5,446,562 A | 8/1995 | Sato |
| 5,459,596 A | 10/1995 | Ueda et al. |
| 5,466,617 A | 11/1995 | Shannon |
| 5,468,987 A | 11/1995 | Yamazaki |
| 5,476,802 A | 12/1995 | Yamazaki |
| 5,479,052 A | 12/1995 | Yuuki |
| 5,485,019 A | 1/1996 | Yamazaki |
| 5,497,021 A | 3/1996 | Tada |
| 5,498,562 A | 3/1996 | Dennison et al. |
| 5,499,123 A | 3/1996 | Mikoshiba |
| 5,504,020 A | 4/1996 | Aomori |
| 5,504,029 A | 4/1996 | Murata et al. |
| 5,508,209 A | 4/1996 | Zhang |
| 5,512,779 A | 4/1996 | Noda |
| 5,521,107 A | 5/1996 | Yamazaki |
| 5,523,257 A | 6/1996 | Yamazaki |
| 5,545,577 A | 8/1996 | Tada |
| 5,563,427 A | 10/1996 | Yudasaka |
| 5,569,620 A | 10/1996 | Linn et al. |
| 5,574,292 A | 11/1996 | Takahashi et al. |
| 5,576,556 A | 11/1996 | Takemura et al. |
| 5,576,655 A | 11/1996 | Fujihira |
| 5,580,381 A | 12/1996 | Yamagata |
| 5,581,092 A | 12/1996 | Takemura |
| 5,583,369 A | 12/1996 | Yamazaki et al. |
| 5,585,949 A | 12/1996 | Yamazaki et al. |
| 5,585,951 A | 12/1996 | Noda et al. |
| 5,612,230 A | 3/1997 | Yuzurihara et al. |
| 5,612,254 A | 3/1997 | Mu et al. |
| 5,623,157 A | 4/1997 | Miyazaki |
| 5,627,084 A | 5/1997 | Yamazaki et al. |
| 5,643,826 A | 7/1997 | Ohtani et al. |
| 5,650,338 A | 7/1997 | Yamazaki |
| 5,663,077 A | 9/1997 | Adachi et al. |
| 5,674,771 A | 10/1997 | Machida et al. |
| 5,680,147 A | 10/1997 | Yamazaki et al. |
| 5,696,386 A | 12/1997 | Yamazaki |
| 5,719,065 A | 2/1998 | Takemura |
| 5,733,797 A | 3/1998 | Yamaha |
| 5,747,355 A | 5/1998 | Konuma et al. |
| 5,786,241 A | 7/1998 | Shimada |
| 5,804,878 A | 9/1998 | Miyazaki |
| 5,808,315 A | 9/1998 | Murakami et al. |
| 5,818,076 A | 10/1998 | Zhang et al. |
| 5,840,616 A | 11/1998 | Sakaguchi et al. |
| 5,849,611 A | 12/1998 | Yamazaki |
| 5,849,627 A | 12/1998 | Linn et al. |
| 5,869,387 A | 2/1999 | Sato et al. |
| 5,879,969 A | 3/1999 | Yamazaki |
| 5,913,112 A | 6/1999 | Yamazaki |
| 5,917,225 A | 6/1999 | Yamazaki |
| 5,945,711 A | 8/1999 | Takemura |
| 5,962,870 A | 10/1999 | Yamazaki |
| 5,962,872 A | 10/1999 | Zhang |
| 5,962,897 A | 10/1999 | Takemura et al. |
| 5,966,594 A | 10/1999 | Adachi et al. |
| 5,982,002 A | 11/1999 | Takasu et al. |

| | | |
|---|---|---|
| 6,013,928 A | 1/2000 | Yamazaki |
| 6,031,290 A | 2/2000 | Miyazaki |
| 6,049,092 A | 4/2000 | Konuma et al. |
| 6,051,453 A | 4/2000 | Takemura |
| 6,078,316 A | 6/2000 | Page |
| 6,121,117 A | 9/2000 | Sato et al. |
| 6,124,904 A | 9/2000 | Sato |
| 6,147,375 A | 11/2000 | Yamazaki |
| 6,150,692 A | 11/2000 | Iwanaga et al. |
| 6,166,414 A | 12/2000 | Miyazaki |
| 6,191,476 B1 | 2/2001 | Takahashi et al. |
| 6,271,066 B1 | 8/2001 | Yamazaki et al. |
| 6,320,224 B1 | 11/2001 | Zhang |
| 6,335,555 B1 | 1/2002 | Takemura |
| 6,448,612 B1 | 9/2002 | Miyazaki |
| 6,455,401 B1 | 9/2002 | Zhang et al. |
| 6,476,447 B1 | 11/2002 | Yamazaki |
| 6,556,257 B2 | 4/2003 | Ino |
| 6,566,711 B1 | 5/2003 | Yamazaki |
| 6,608,353 B2 | 8/2003 | Miyazaki |
| 6,624,450 B1 | 9/2003 | Yamazaki |
| 6,808,965 B1 | 10/2004 | Miyasaka et al. |
| 6,849,872 B1 | 2/2005 | Yamazaki et al. |
| 6,867,431 B2 | 3/2005 | Konuma et al. |
| 6,875,999 B2 | 4/2005 | Koyama |
| 6,972,435 B2 | 12/2005 | Ohtani |
| RE39,484 E | 2/2007 | Bruel |
| 7,301,209 B2 | 11/2007 | Takemura et al. |
| 7,381,599 B2 | 6/2008 | Konuma et al. |
| 7,525,158 B2 | 4/2009 | Konuma et al. |
| 7,569,856 B2 | 8/2009 | Konuma et al. |
| 2002/0051382 A1 | 5/2002 | Matsubara |
| 2002/0163043 A1 | 11/2002 | Zhang |
| 2002/0179969 A1 | 12/2002 | Miyazaki |
| 2003/0173570 A1 | 9/2003 | Yamazaki |
| 2003/0189210 A1 | 10/2003 | Yamazaki et al. |
| 2004/0023445 A1 | 2/2004 | Miyazaki |
| 2004/0031961 A1 | 2/2004 | Zhang et al. |
| 2004/0051102 A1 | 3/2004 | Miyazaki |
| 2007/0007529 A1 | 1/2007 | Takemura et al. |
| 2008/0246039 A1 | 10/2008 | Zhang |

FOREIGN PATENT DOCUMENTS

| | | |
|---|---|---|
| EP | 0 603 866 | 6/1994 |
| JP | 55-050663 | 4/1980 |
| JP | 55-050664 | 4/1980 |
| JP | 55-041703 | 8/1980 |
| JP | 56-081973 | 7/1981 |
| JP | 56-111258 | 9/1981 |
| JP | 57-058363 | 4/1982 |
| JP | 57-104218 | 6/1982 |
| JP | 58-037967 | 3/1983 |
| JP | 58-197761 | 11/1983 |
| JP | 60-136259 | 7/1985 |
| JP | 60-202931 | 10/1985 |
| JP | 61-220341 | 9/1986 |
| JP | 62-084562 | 4/1987 |
| JP | 62-274729 | 11/1987 |
| JP | 63-314862 | 12/1988 |
| JP | 63-318779 | 12/1988 |
| JP | 64-032678 | 2/1989 |
| JP | 64-054762 | 3/1989 |
| JP | 01-156725 | 6/1989 |
| JP | 02-025024 | 1/1990 |
| JP | 02-039541 | 2/1990 |
| JP | 02-100024 | 4/1990 |
| JP | 02-159730 | 6/1990 |
| JP | 02-214152 | 8/1990 |
| JP | 02-234134 | 9/1990 |
| JP | 03-020046 | 1/1991 |
| JP | 03-095938 | 4/1991 |
| JP | 03-095939 | 4/1991 |
| JP | 03-126921 | 5/1991 |
| JP | 03-280018 | 12/1991 |
| JP | 03-280420 | 12/1991 |
| JP | 04-142740 | 5/1992 |
| JP | 04-155834 | 5/1992 |
| JP | 04-180219 | 6/1992 |
| JP | 04-196328 | 7/1992 |
| JP | 04-239731 | 8/1992 |
| JP | 04-299566 | 10/1992 |
| JP | 04-348532 | 12/1992 |
| JP | 04-358129 | 12/1992 |
| JP | 05-055581 | 3/1993 |
| JP | 05-055582 | 3/1993 |
| JP | 05-082442 | 4/1993 |
| JP | 05-114724 | 5/1993 |
| JP | 05-218410 | 8/1993 |
| JP | 05-226364 | 9/1993 |
| JP | 05-232515 | 9/1993 |
| JP | 05-249478 | 9/1993 |
| JP | 05-259458 | 10/1993 |
| JP | 05-275373 | 10/1993 |
| JP | 05-299581 | 11/1993 |
| JP | 05-315355 | 11/1993 |
| JP | 06-067210 | 3/1994 |
| JP | 06-130414 | 5/1994 |
| JP | 06-169086 | 6/1994 |
| JP | 06-232160 | 8/1994 |
| JP | 06-242433 | 9/1994 |
| JP | 06-291314 | 10/1994 |
| JP | 06-267210 | 9/1997 |
| JP | 02 044769 | 2/1999 |
| KR | 92-10788 | 6/1992 |
| WO | WO 92/14268 | 8/1992 |

OTHER PUBLICATIONS

Okuyama et al., "Water-Related Threshold Voltage Instability of Polysilicon TFTs," pp. 527-530, 1993, IEDM 93.

Shimoyama et al., "Increased Hot-Carrier Degradation Due to Water in TEOS/O$_3$-Oxide (1)," p. 723, 1992, Extended Abstracts (The 39.sup.th Spring Meeting, 1992); The Japan Society of Applied Physics and Related Societies, No. 2, 30p-ZM-3, (English Abstract only). c.

Shimoyama et al., "Increased Hot-Carrier Degradation Due to Water in TEOS/O$_3$—Oxide(2)-Water Blocking Effect of an ECR-SiO$_2$ Film Under TEOS/ O$_3$-Oxide and Improvement of Hot-Carrier Tolerance," p. 723, 1992, Extended Abstracts (The 39.sup.th Spring Meeting); The Japan Society of Applied Physics and Related Societies, No. 2, 30p-ZM-4, (English Abstract).

* cited by examiner

SEMICONDUCTOR DEVICE AND A METHOD FOR MANUFACTURING THE SAME

CROSS-REFERENCE TO RELATED APPLICATIONS

This application is a continuation of U.S. application Ser. No. 11/979,127, filed Oct. 31, 2007, now allowed, which is a continuation of U.S. application Ser. No. 11/634,904, filed Dec. 7, 2006, now U.S. Pat. No. 7,301,209, which is a divisional of U.S. application Ser. No. 10/935,177, filed Sep. 8, 2004, filed, now U.S. Pat. No. 7,170,138, which is a divisional of U.S. application Ser. No. 10/028,269, filed Dec. 28, 2001, now U.S. Pat. No. 6,835,607, which is a divisional of U.S. application Ser. No. 09/311,067, filed May 13, 1999, now U.S. Pat. No. 6,335,555, which is a divisional of U.S. application Ser. No. 08/966,975, filed Nov. 10, 1997, now U.S. Pat. No. 5,945,711, which is a divisional of U.S. application Ser. No. 08/313,910, filed Sep. 28, 1994, now U.S. Pat. No. 5,719,065, which claims the benefit of foreign priority applications filed in Japan as Ser. No. 5-269780 on Oct. 1, 1993 and Ser. No. 6-191020 on Jul. 21, 1994, all of which is incorporated by reference.

BACKGROUND OF THE INVENTION

The preset invention relates to a semiconductor device and a manufacturing method for the same. In particular, the present invention is directed to an insulated gate field effect transistor (TFT) formed on an insulating surface, for example, a surface of an insulating substrate such as glass, or an insulating film such as silicon oxide formed on a silicon wafer. Also, the present invention is advantageous for the formation of an insulated gate field effect transistor, especially of an N-channel type, which is driven at a relatively high voltage. It is also to be understood that the present invention is further advantageous for the formation of a TFT on a glass substrate of which glass transition temperature (i.e. distortion point) is 750° C. or lower.

Moreover, the present invention is related to an active matrix of a liquid crystal device, a driving circuit of an image sensor or a three dimensional integrated circuit (hybrid IC) using the foregoing semiconductor devices.

In the prior art, TFTs have been known for driving an active-matrix type liquid crystal device or an image sensor or the like. Specifically, in place of an amorphous TFT using an amorphous silicon as an active layer, crystalline TFTS having a higher mobility are now being developed in order to increase driving speed. Moreover, TFTs having a high resistivity region (high resistivity drain) in an active region thereof have been proposed in order to further improve the device characteristics and to increase the capability of driving with a higher voltage. The "high resistivity region" or "high resistivity drain" in the present invention includes an impurity region (drain) having a higher resistivity, a lightly doped drain (LDD), and also an offset region where a gate electrode does not overlap an impurity region.

However, negative charges caused by hot carriers in an N-channel type TFT tend to be trapped in a portion of a gate insulating film close to a drain region so that the conductivity type of the high resistivity region shifts to p-type. As a result, the source/drain current is obstructed.

Also, it is necessary to use a photolithography technique to form a high resistivity region. This means that production yield and a uniformity of characteristics in the obtained TFTs can not be improved.

SUMMARY OF THE INVENTION

It is an object of the present invention to improve the quality of TFTs and the manufacturing yield by solving the foregoing problems. Specifically, it is an object of the present invention to prevent degradation caused by hot carriers, and to produce a high resistivity region in a self-aligning manner without using a photolithography process.

It is a further object of the present invention to manufacture a liquid crystal device using the TFTs of the present invention.

It is still another object of the present invention to produce TFTs which have a high resistivity against water which tends to be contained in an interlayer insulator, especially, formed from TEOS gas.

It is still another object of the invention to utilize electrical charges occurring in an interlayer insulating film to stabilize the property of TFTs.

In accordance with the present invention, a TFT comprises an active semiconductor layer including at least source, drain and channel regions, and further a high resistivity region between the source and channel regions and/or the drain and channel regions, wherein a film which is capable of trapping positive charges is formed adjacent to the high resistivity region. FIG. 1 shows a typical example of this structure.

In FIG. 1, an N-region 111 is interposed between a source region 110 having an N-type and a channel region 3. A gate insulating film 104 exists on the N-region 111. Further, a silicon nitride film 114 which is capable of trapping positive ions therein is formed on the source region and the gate insulating film 104. It is to be understood that even if hot electrons are injected into the gate insulating film from the active layer close to the source region, these can be neutralized by the positive charges existing in the silicon nitride film 114. Accordingly, the high resistivity region can function correctly. Also, the TFT shown in FIG. 1 includes an offset region between the channel region 3 and the high resistivity region 111. The offset region is an extension of the channel region and has a same conductivity type as the channel region (intrinsic).

BRIEF DESCRIPTION OF THE DRAWINGS

The foregoing objects and features of the invention will be described in preferred embodiments of the invention with reference to the attached drawings in which.

PREFERRED EMBODIMENT OF THE INVENTION

In a preferred embodiment of the invention, a film having a capability of trapping positive charges, for example, silicon nitride is formed on a high resistivity region in direct contact therewith or with a gate insulating silicon oxide film interposed therebetween. The thickness of the positive charge trapping layer is, for example, 200-2000 Å. The positive charges trapped in the film make the conductivity type of the high resistivity region adjacent thereto slightly N-type, or neutralize negative charges injected into the gate insulating film, thereby, avoiding a degradation caused by hot carriers. For, example, when applying a +15 V to a drain and −20V to a gate, negative charges caused by impact ionization are not trapped by a silicon oxide film when the silicon oxide film does not exist on the high resistivity region. Also when the silicon oxide film exists on the high resistivity region and the negative charges are trapped therein, the charges will be neutralized by the positive charges. Therefore, it is possible to prevent the high resistivity region from becoming P-type.

Figure 1:
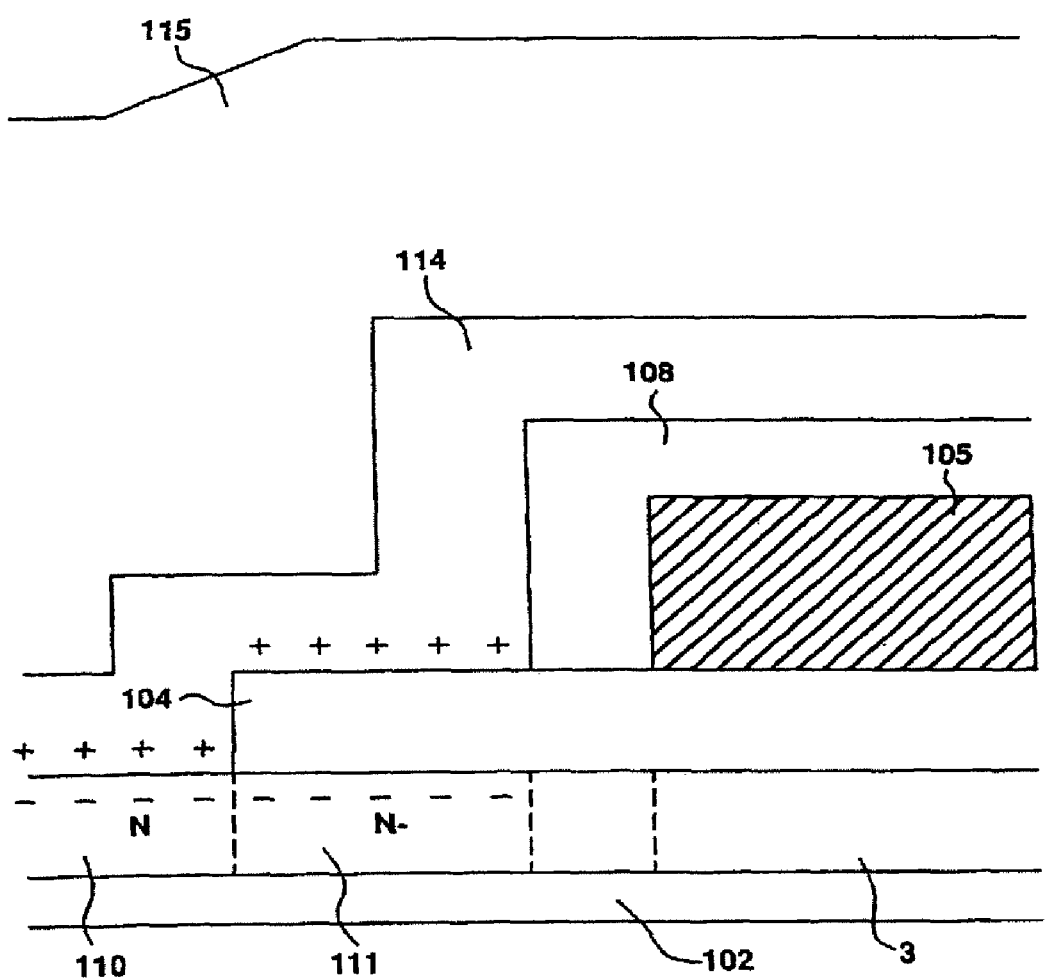
FIG. 1 shows a partial cross sectional view of a TFT in accordance with the present invention.
Figure 2A:
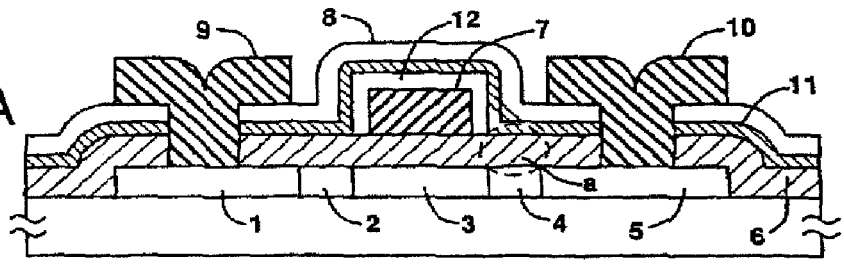
FIGS. 2A to 2D show cross sectional views of TFTs in accordance with a preferred embodiment of the present invention.

FIGS. 2A-2D show various examples of locational relations between the positive charge trapping layer and the gate insulating film. In FIG. 2A, the TFT has a channel region 3, source and drain regions 1 and 5, a gate insulating film 6, a gate electrode 7, an anodic oxide film 12 surrounding the gate electrode and further a pair of high resistivity regions 2 and 4. Also, an interlayer insulator 8 is formed on the upper surface of the TFT and source and drain electrodes 9 and 10 are provided therethrough. Further, a charge trapping film 11 is provided as shown in the figure.

Specifically, in FIG. 2A, the gate insulating film 6 covers the entire active layer including the source and drain regions 1 and 5. The charge trapping layer 11 is superimposed on the gate insulating film.

Figure 2B:
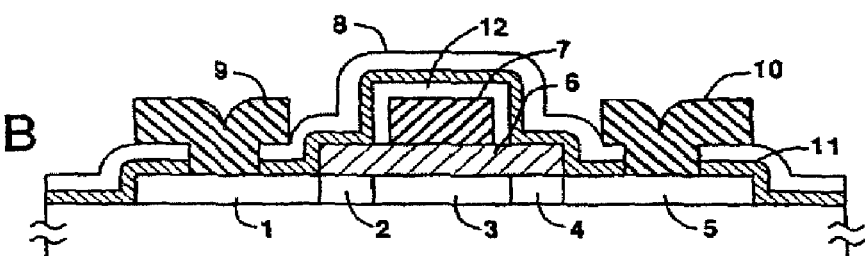

In FIG. 2B, the gate insulating film 6 extends beyond the edges of the channel region 3 to cover the high resistivity regions 2 and 4, however, it does not cover the source and drain regions. Accordingly, the charge trapping layer 11 is separated from the high resistivity regions 2 by the gate insulating layer 6 but it directly contacts the source and drain regions 1 and 5.

Figure 2C:
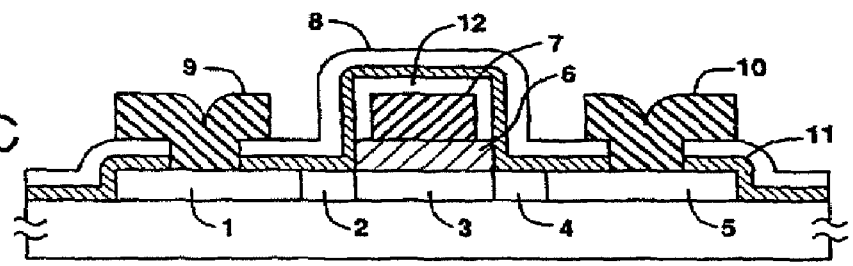

In FIG. 2C, the gate insulating layer covers only the channel region so that the charge trapping layer 11 is in direct contact with both of the source and drain regions and the high resistivity regions. Furthermore, the configuration shown in FIG. 2D is a modification of the configuration of FIG. 2B (or FIG. 2A) where the portion of the gate insulating layer which extends beyond the gate electrode is thinned.

In the case of the structure shown in FIG. 2A or 2B, when negative charges are trapped due to a hot carrier injection in the portion of the gate insulating film near the high resistivity region 2 next to the drain region 5, (marked with "a" in the figure), the positive charges trapped in the charge trapping layer 11 neutralize the negative charges. In order that the influence of the positive charges in the trapping layer 11 extends to the high resistivity region, the gate insulating film should not be so thick. For example, it is preferable that the gate insulating film be 500 Å or less.

In the case of FIG. 2C, the gate insulating layer does not exist on the high resistivity regions 2 and 4. Therefore, the conductivity type of the high resistivity region 2 is always a weak N-type because of the existence of the positive charges trapped in the charge trapping layer. It is desirable that the silicon nitride film is formed by a photo CVD or thermal CVD rather than a plasma CVD in order to avoid a damage to the active layer by a plasma.

Figure 2D:
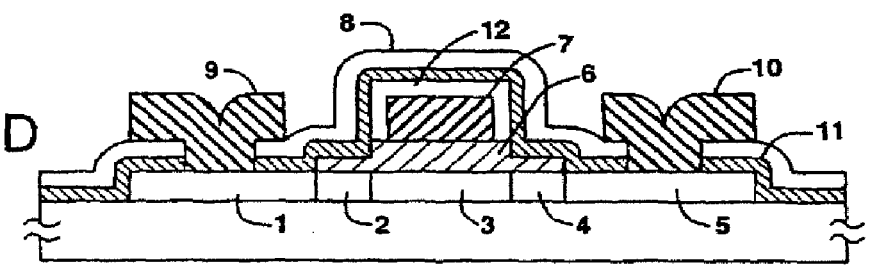

Also, in the case of FIG. 2D, the portion of the gate insulating film 6 located on the high resistivity region is etched to become thinner than the portion of the gate insulating film located on the channel region in order to enhance the influence of the positive charges trapped in the charge trapping layer. This structure is advantageous because the thickness of the gate insulating film on the channel region can be made thick so that there is no danger that the reliability of the gate insulating film be hindered. Alternatively, the insulating film may cover the entire surface of the source and drain regions.

In the present invention, the high resistivity regions are formed in a self-aligning manner using a gate electrode and an anodic oxide film formed by anodizing the gate electrode. The thickness of the anodic oxide film can be accurately controlled with a high uniformity. For example, it can be made thinner than 1000 Å, alternatively, it can be made thicker than 5000 Å (for example, 1 μm) if desired. Accordingly, the thickness (width) of the high resistivity region can be freely and accurately controlled by the use of the anodic oxide film.

Also, there are two types of anodic oxides used in the present invention. One is a barrier type anodic oxide while the other is a porous anodic oxide When a barrier type anodic oxide is to be etched, it is necessary to use an etchant containing a hydrofluoric acid. However, a porous anodic oxide may be etched with a phosphoric acid containing etchant. Accordingly, it is possible to etch a porous anodic oxide without damaging silicon or silicon oxide which constitutes the TFT. Also, both of the porous anodic oxide and a barrier type anodic oxide are difficult to be etched by dry etching. In particular, a selection ratio is especially high with respect to silicon oxide. Accordingly, the configuration of FIG. 2B can be obtained in the following manner.

A porous anodic oxide is initially formed at 1 μm, for example, on at least side surfaces of the gate electrode. A portion of the gate insulating film which extends beyond the gate electrode removed by etching using the anodic oxide as a mask, following which the porous anodic oxide is removed. As a result, the gate insulating film extends beyond the side edges of the gate electrode by about 1 μm as shown in FIG. 2B. In order to obtain the high resistivity regions 2 and source and drain regions 1 and 5, an N-type impurity ion is introduced from an upper portion of the gate electrode. In the case of an impurity ion having a certain energy, for example, phosphorous ions of 30 keV, the impurity distributes in a depth direction in accordance with a Gaussian distribution and the maximum concentration is at about 100 Å deep from an upper surface. Accordingly, while a region of the active layer on which the gate insulating layer is not placed can be added with the impurity at a relatively higher concentration, the region of the semiconductor under the extension of the gate insulating film is not added with the impurity so much because most of the impurity is blocked by the insulating film.

Accordingly, the source and drain regions 1 and 5 doped with the impurity at a high concentration are formed while the high resistivity regions 2 added with the impurity at a lower concentration by one or two digits are formed under the extended portion of the gate insulating film. When decreasing the acceleration energy of the impurity ion, the amount of the impurity to be introduced into the high resistivity regions through the insulating film becomes smaller and the conductivity type thereof becomes the same as that of the channel region.

Example 1

A manufacturing process of a TFT in accordance with the present invention will be explained with reference to FIGS. 3A to 3H.

Initially, a non-alkaline glass substrate 101, for example, Corning 7059 (300 mm×400 mm or 100 mm×100 mm) is coated with a silicon oxide film 102 of 1000-3000 Å thick. The Silicon oxide film may be formed by sputtering in an oxygen atmosphere. However, it is preferable to use a plasma CVD with a TEOS (tetra ethoxy silane) gas used as a starting material to improve the productivity. In place of silicon oxide, other materials may be used. For example, a single layer of aluminum nitride, a double layer of silicon nitride and aluminum nitride. Aluminum nitride may be formed by a reactive sputtering in a nitrogen atmosphere.

Then, an active layer 103, for example, crystalline silicon is formed on the silicon oxide film 102. The "crystalline silicon" in this invention may be any form of silicon if it includes crystals at least partly, for example, single crystal, polycrystal or semiamorphous. In this example, an amorphous silicon film is formed to a thickness of 300-5000 Å, preferably, 500-1000 Å through a plasma CVD or LPCVD, and then the film is crystallized by exposing it in a reducing atmosphere at 550-600° C. for 24 hours. This step can be done using a laser annealing. Finally, the active layer 103 is obtained by patterning the crystallized film.

Then, an insulating film 104 made of silicon oxide for example is formed covering the active layer 103 to form a gate insulating film. The thickness of the insulating film is 300-1500 Å, for example, 500 Å or less. A sputtering method can be used to form this film.

On the insulating film 104, an anodizable material is formed for forming a gate electrode. Examples of anodizable materials are aluminum, tantalum, titanium and silicon. These materials may be used in a single layer form, respectively. Alternatively, it is possible to use a multi-layer form using two or three of these materials, for example, a double layered structure consisting of aluminum on which titanium silicide is superimposed, or a double layered structure consisting of titanium nitride on which aluminum is superimposed. The thickness of each layer may be varied depending upon the desired device character. In this example, an aluminum film containing Si at 1 weight % or Sc at 0.1-0.3 weight % formed by electron beam evaporation or sputtering is used.

Further, a film which will function as a mask in a subsequent anodization step is formed on the aluminum film. A photoresist material (e.g. OFPR 800/30 cp manufactured by Tokyo Oka) formed by spin coating is used as the mask film. Also, it is desirable to form a barrier type anodic oxide film on the surface of the aluminum film at 100-1000 Å prior to the formation of the photoresist material in order to improve the adhesivity of the photoresist material. Further, the barrier type anodic oxide film prevents the formation of a porous anodic oxide on the upper portion of the aluminum in the later step.

Figure 3A:
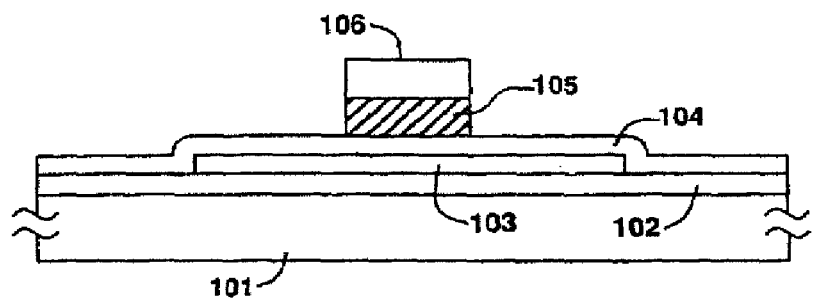
FIGS. 3A to 3H show a manufacturing process of a TFT in accordance with a first example of the invention.

Then, the aluminum film together with the photoresist film is patterned into a gate electrode 105 and a mask film 106 as shown in FIG. 3A.

Figure 3B:
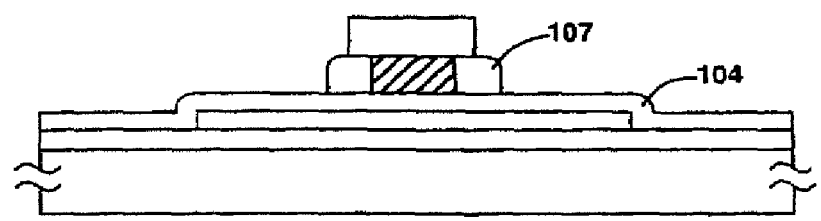

Referring to FIG. 3B, the gate electrode 105 is supplied with an electric current in an electrolyte to form a porous type anodic oxide film 107 only on the side surface of the gate electrode. The porous type anodic oxide film can be obtained by using an acid electrolyte, for example, aqueous solution of 3-20% citric acid, oxalic acid, phosphoric acid, chromic acid or sulfuric acid. The applied voltage is relatively low, for example, in the range of 10-30 V while the current is maintained constant. With this low voltage, the porous anodic oxide can be grown to 0.3-25 μm thick, for example, as thick as 1.0 μm.

In this example, the thickness of the anodic oxide 107 is preferably, from 0.3 to 2 μm, for example, 0.5 μm. The temperature of the oxalic acid is kept 30° C. The applied voltage is 10 V. The anodization is performed for 20-40 minutes. The thickness of the film is controlled by the anodization time.

Also, after the formation of the porous anodic oxide 107, it is preferable to form a barrier type anodic oxide 108 on the side surface and the top surface of the gate electrode by performing the anodization in the following manner.

Figure 3C:
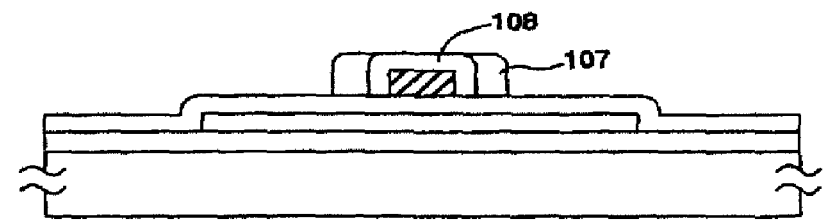

Namely, after removing the mask 106, the gate electrode is applied with an electric current in an electrolyte. An ethylene glycol solution containing 3-10% tartaric acid, boric acid or nitric acid is used in this anodization. The temperature of the solution is preferably kept lower than the room temperature (20° C.), for example, about 10° C. to improve the quality of the film. The thickness of the anodic oxide 108 increases in proportion to the increase in the magnitude of the applied voltage. When the applied voltage is 150 V, the film is as thick as 2000 Å. The thickness of the film should be determined depending upon the desired size of an offset or overlap region. However, it is necessary to apply more than 250 V voltage to increase the thickness of the film exceeding 3000 Å. Accordingly, it is preferable that the thickness be less than 3000 Å so that a necessity of using such a high voltage which is harmful for the TFT characteristics should be avoided. (FIG. 3C)

It should be noted that the barrier type anodic oxide 108 is formed inside the porous anodic oxide 107 even though it is formed after the formation of the porous anodic oxide. The etching rate of the porous anodic oxide by the phosphoric acid etchant is more than ten times larger than that of the barrier type anodic oxide. Accordingly, the barrier type anodic oxide is hardly etched by the phosphoric acid etchant and therefore it protects the aluminum gate electrode when etching the porous type anodic oxide 107 in the later step.

Figure 3D:
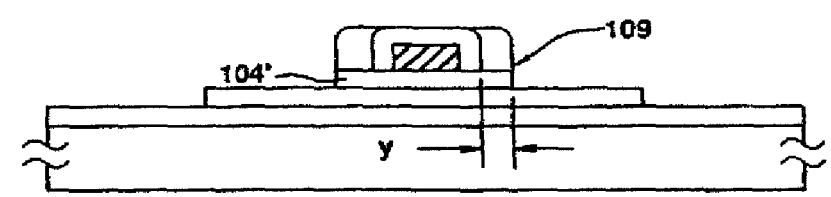

After the formation of the porous type anodic oxide, the insulating film 104 is patterned into the gate insulating film 104' as shown in FIG. 3D using the porous anodic oxide as a mask. The etching depth can be determined arbitrarily. That is, the insulating film may be completely removed to expose a surface of the active layer as shown in the drawing, or only an upper portion of the insulating film may be removed so that the active layer is not exposed. However, it is desirable to completely etch the insulating film from the view point of productivity, production yield, uniformity. The portion of the insulating film 104 located below the gate electrode and the porous anodic oxide remains the same thickness as it is formed.

The etching of the insulating film 104 is a dry etching using a plasma and it may be either an isotropic etching or an anisotropic etching (RIE). It is necessary that a selection ratio between silicon and silicon oxide should be sufficiently large so that the active layer should not be etched so much. A $CF_4$ gas is used as an etchant in this example.

Also, when the gate electrode is mainly formed of aluminum, tantalum or titanium and the insulating film 104 is mainly formed of silicon oxide, a fluorine containing etchant gas is suitable since the silicon oxide is easily etched while etching rates of alumina, tantalum oxide and titanium oxide are sufficiently small. Alternatively, a wet etching may also be used using an etchant containing a hydrofluoric acid such as a 1/100 hydrofluoric acid.

Figure 3E:
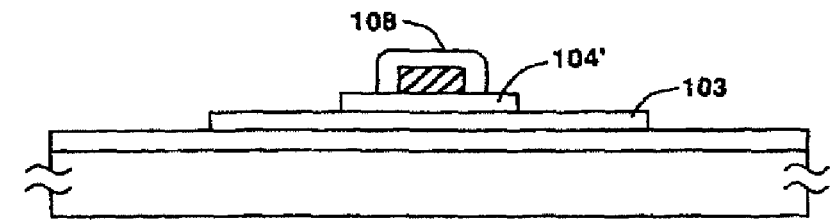

After the formation of the gate insulating film 104', the porous anodic oxide 107 is removed by using a phosphoric acid containing etchant. For example, a mixed acid including phosphoric acid, acetic acid and nitric acid. An etching rate is about 600 Å/minute. The underlying gate insulating layer 104' remains without being etched as shown in FIG. 3E.

Thus, the gate insulating layer 104' is formed, which extends beyond the outer edges of the barrier type anodic oxide 108 by a distance "y" as indicated in FIG. 3D. The distance "y" is determined by the thickness (width) of the porous anodic oxide film 107 in a self-aligning manner as is understood from the foregoing explanation.

Figure 3F:
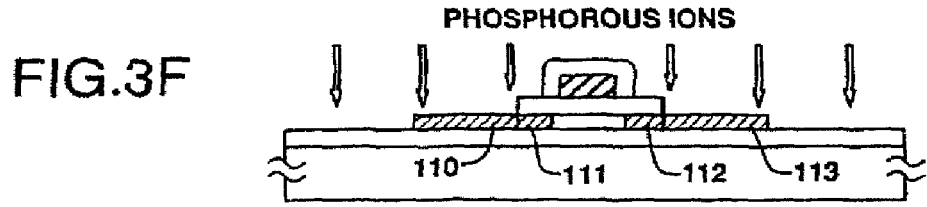

Then, referring to FIG. 3F, N-type impurity ions, for example, phosphorous ions are introduced into a portion of the active layer by ion doping using the gate electrode 105 with the anodic oxide 108 formed thereon and the extended portion of the gate insulating layer 104' used as a mask. The dose is $1 \times 10^{14}$ to $5 \times 10^{15}$ atoms/cm$^2$, for example, $2 \times 10^{15}$ atoms/cm$^2$. The acceleration energy is 10-60 keV, for example, 40 keV. The doping gas is phosphine (PH$_3$). At this condition, the regions 110 and 113 are added with the impurity at a sufficiently high concentration to form source and drain regions, for example, $1 \times 10^{20}$ to $2 \times 10^{21}$ atoms/cm$^3$ while the regions 111 and 112 are added with the impurity at a little concentration, for example, $1 \times 10^{17}$ to $2 \times 10^{18}$ atoms/cm$^3$ because of the existence of the gate insulating film thereon. The impurity concentration is measured by a secondary ion mass spectrography (SIMS). Also, these concentrations correspond to dose amounts $5 \times 10^{14}$-$5 \times 10^{15}$ atoms/cm$^2$ and $2 \times 10^{13}$-$5 \times 10^{14}$ atoms/cm$^2$, respectively. Generally, the concentration of the impurity in the source and drain regions 110 and 113 should be higher than that in the high resistivity regions 111 and 112 by 0.5 to 3 digits.

As a result, source and drain regions having a relatively lower resistivity 110 and 113, and high resistivity regions 111 and 112 are formed.

Figure 3G:
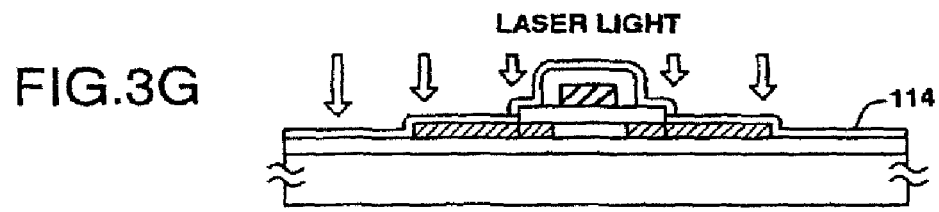

Subsequently, as shown in FIG. 3G, a silicon nitride film 114 is formed through a plasma CVD to a thickness of 200-2000 Å on the entire surface. A mixture of silane (SiH$_4$) and ammonium (NH$_3$) at a ratio 1:5 is used. The substrate temperature is 250-400° C., for example, 350° C. If the amount of silane is increased, the silicon nitride contains an excess silicon, resulting in the formation of trap centers of positive charges at a higher concentration. However, the insulating property is hindered if the amount of silane is too increased.

Alternatively, the silicon nitride film may be formed through a low pressure CVD or by injecting nitrogen ions into the silicon film.

After the formation of the silicon nitride film 114, a XeF excimer (wavelength: 355 nm, pulse width: 40 n sec.) is irradiated in order to activate the impurity ions introduced into the active layer. A wavelength of the laser should be so selected that the laser light may transmit through the silicon nitride film.

In place of the excimer laser, other lasers may also be used. However, pulsed lasers are desirable rather than continuous wave lasers (CW lasers) because irradiation time of CW lasers is long and there is a danger that the irradiated film is thermally expanded and peeled off.

As to examples of pulsed laser, there are a laser of an IR light such as Nd:YAG laser (Q switch pulse oscillation is preferred), a second harmonic wave of the Nd:YAG (visible light), and a laser of a UV light such as excimer laser of KrF, XeCl and ArF. When the laser beam is emitted from the upper side of a metal film, it is necessary to select wavelengths of the laser in order not to be reflected by the metal film. However, there is no problem when the metal film is enough thin. Also, it is possible to emit the laser from the substrate side. In this case, it is necessary to select a laser which can transmit through the silicon.

Also, instead of the laser annealing, a lump annealing of visible light or near infrared light may be employed. In such a case, the annealing is performed in order to heat the surface region to 600-1000° C., for example, for several minutes at 600° C. or several tens seconds at 1000° C. An annealing with a near infrared ray (e.g. 1.2 μm) does not heat the glass substrate so much because the near infrared ray is selectively absorbed by silicon semiconductors. Further, by shortening the irradiation time, it is possible to prevent the glass from being heated.

After the activation of the impurity, hydrogen ions are introduced by ion doping into the active layer. The acceleration energy is 10-50 kV, for example, 20 kV. The dose is $1 \times 10^{14}$ to $5 \times 10^{15}$ atoms/cm$^2$, for example, $1 \times 10^{15}$ atoms/cm$^2$. This is carried out because the silicon nitride film may not transmit hydrogen therethrough by normal heat annealing. Accordingly, hydrogen can be auto-doped into a region between the channel region and the source/drain regions. Also, it is desirable to carry out the ion doping of hydrogen after the laser activation of the added impurity.

Figure 3H:
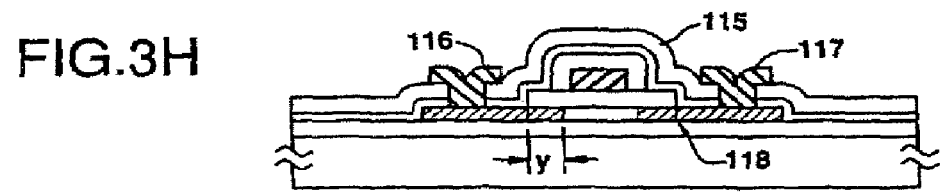

Referring to FIG. 3H, an interlayer insulator 115 is formed by depositing silicon oxide through a plasma CVD to a thickness of 2000 Å to 1 μm, for example, 3000 Å. Subsequently, contact holes are formed through the interlayer insulator and aluminum electrode or wiring 116 and 117 are formed therethrough. Then, the entire structure is annealed at 200-400° C. in a nitrogen atmosphere in order to activate the hydrogen atoms introduced in the former step. Thus, the TFT is completed.

Example 2

This example employs the same process as described in the first example until the structure shown in FIG. 3E is obtained. Thus, redundant explanations will be omitted. However, the thickness of the insulating film 104 in this example is thicker than that in the first example. For example, the insulating film is 1000-1500 Å thick, for example, 1200 Å, so that a gate leak current can be minimized and it can be endure a high voltage during the anodic oxidation.

Figure 4A:
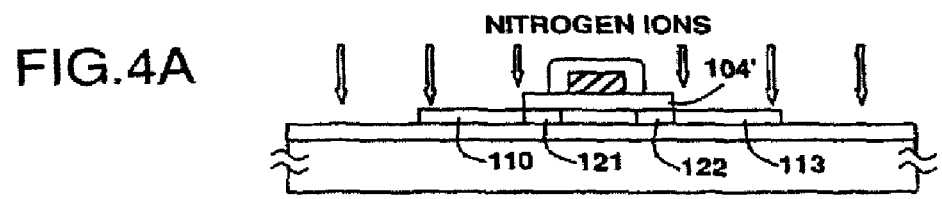
FIGS. 4A to 4C show a manufacturing process of a TFT in accordance with a second example of the invention.

Referring to FIG. 4A which corresponds to FIG. 3E, ion doping of nitrogen ions is carried out using the gate electrode and the insulating film 104' as a mask at a dose of $1 \times 10^{14}$-$3 \times 10^{16}$ atoms/cm$^2$, for example, $2 \times 10^{15}$ and with an acceleration voltage of 50-100 kV, for example, 80 kV. The acceleration voltage is made so high that the nitrogen ions almost pass through the regions 110 and 113 of the active layer on which the insulating film 104' does not exist. Accordingly, the regions 110 and 113 are not effectively doped with nitrogen. The concentration of the nitrogen is less than $1 \times 10^{19}$ atoms/cm$^3$ when measured by SIMS. On the other hand, in the regions 121 and 122 under the extended portion of the gate insulating film 104', the concentration of the nitrogen takes its maximum, namely $5 \times 10^{19}$-$2 \times 10^{21}$ atoms/cm$^3$ (depending on the depth). Thus, the regions 121 and 122 will function as high resistivity regions.

Figure 4B:
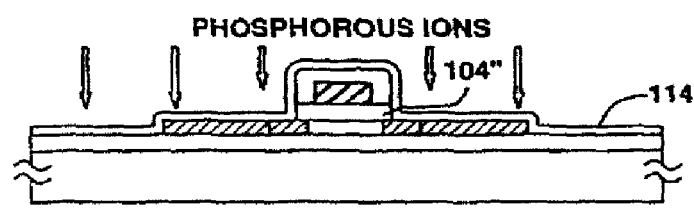

Then, referring to FIG. 4B, the gate insulating film 104' is further patterned into the gate insulating film 104" in a self-aligning manner with respect to the barrier anodic oxide 108. Then, a silicon nitride film 114 is formed in the same manner as in the first example through a plasma CVD to a thickness of 200-2000 Å, for example, 1000 Å. Further, phosphorous ions are introduced into the active layer by ion doping. The dose is $5 \times 10^{14}$-$5 \times 10^{15}$ atoms/cm$^2$. The acceleration voltage is 50-100 kV, for example, 80 kV. Phosphine is used as a dopant gas. As a result, the regions 110, 113 and 121, 122 are doped with the same amount of phosphorous. When measured by SIMS, the concentration of the phosphorous is $1\times10^{20}$ to $2\times10^{21}$ atoms/cm$^3$ which corresponds to a dose of $5\times10^{14}$-$5\times10^{15}$ atoms/cm$^2$. However, because of the existence of nitrogen, the regions 121 and 122 have a higher resistivity than the regions 110 and 113. Also, the silicon nitride film prevent the surface of the active layer from being damaged during the ion doping of the phosphorous.

The phosphorous ions and nitrogen ions are activated by a subsequent annealing step, for example, with an excimer laser (wavelength 355 nm, pulse width 40 n sec.). Thereafter, hydrogen ions are introduced by ion doping in the same manner as in the first example.

Figure 4C:
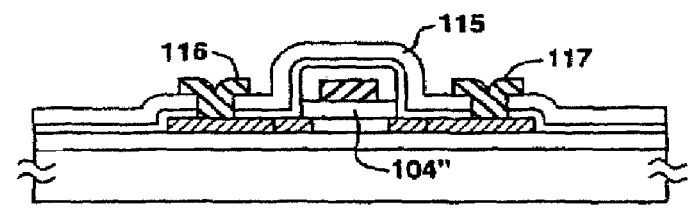

Finally, referring to FIG. 4C, an interlayer insulator 115 of 3000 Å comprising silicon oxide is formed by CVD. Aluminum electrode or wiring 116 and 117 are formed through contact holes formed in the interlayer insulator. Further, an annealing at 200-400° C. in a nitrogen atmosphere is conducted. Thus, a TFT in accordance with the second example is completed.

Figure 5A:
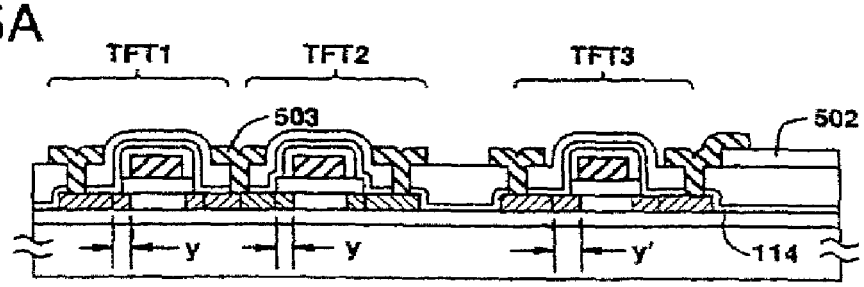
FIGS. 5A to 5C show examples of monolithic circuits employing TFTs in accordance with the present invention.

Referring to FIG. 5A, an example of a monolithic circuit using the TFT in accordance with the present invention will be described. The monolithic circuit is used for example as a circuit substrate of an active matrix liquid crystal device where both of pixel TFTs and peripheral circuits formed of TFTs are integrally formed on a same substrate. In the figure, TFTs 1-3 are shown. TFTs 1 and 2 are used as driver TFTs of which barrier type anodic oxide is 200-2000 Å thick, for example, 1000 Å. The gate electrode and the high resistivity regions slightly overlap each other because of a diffraction of impurity ions during the ion doping. The drain of TFT1 of N-channel type and the drain of TFT2 of p-channel type are connected with each other through a wiring 503. Also, the source of TFT1 is grounded while the source of TFT2 is connected to a power source so that a CMOS inverter is constructed. It should be noted that other types of a CMOS circuit may be used as a peripheral circuit.

On the other hand, the TFT 3 is used as a pixel TFT for driving a pixel. The thickness of the anodic oxide is 1000 Å as well as TFT 1 and TFT 2. However, while the width "y" of the high resistivity regions in TFT1 and TFT2 is as thin as 0.2 μm (for example), the width of the high resistivity regions in TFT 3 is made as thick as 0.4-2 μm, for example, 0.5 μm in order to reduce a leak current and a parasitic capacitance between the gate and the drain. In order to change the width of the high resistivity region, the thickness of the porous anodic oxide is controlled as explained above. For this reason, it is desirable that the gate electrode of each TFT be separated from one another so that the anodic oxidation may be performed with respect to each gate electrode of the TFTs, independently.

Also, while the TFTs 1 and 3 are N-channel type, the TFT 2 is P-channel type. Accordingly, the process of the first and second examples is not suitable for the formation of the TFT 2. For this reason, while the gate insulating film 104' is patterned into the film 104" as shown in FIG. 4C, this step should not be done on the TFT 2 so that the silicon nitride film 114 does not contact the high resistivity regions, directly. If the silicon nitride film directly contacts the high resistivity regions, the positive charges trapped in the silicon nitride film invert the conductivity type of the high resistivity regions to N-type, resulting in obstructing the source/drain current. For this reason, the P-channel TFT has a configuration such as shown in the drawing.

Example 3

Figure 6A:
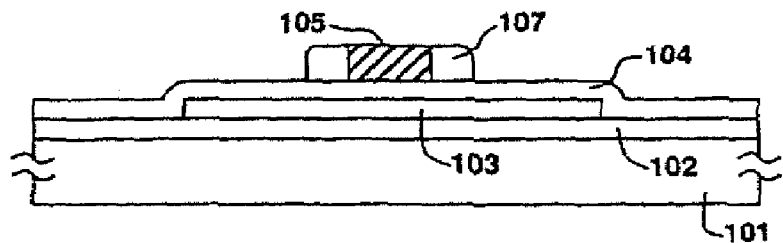
FIGS. 6A to 6F show a manufacturing process of TFT in accordance with the third example of the invention.

Referring to FIG. 6A, in the same manner as in the first example, an underlying film comprising silicon oxide 102, an island form silicon film 103 of 800 Å having a crystallinity, a silicon oxide film 104 of 1200 Å, a gat electrode 105 made of aluminum of 200 nm-1 μm thick, and a porous anodic oxide film 107 (3000 Å-1 μm, e.g. 5000 Å thick) on the side surface of the gate electrode are formed on a Corning 7059 glass substrate 101.

Figure 6B:
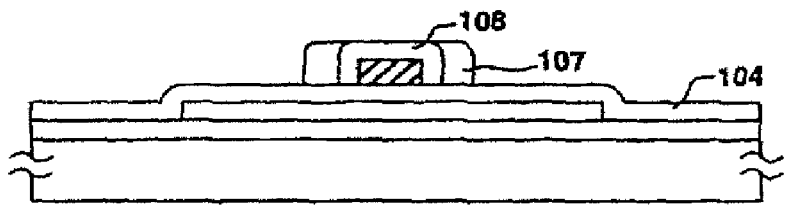

Further, a barrier type anodic oxide film 108 is formed to a thickness of 1000-2500 Å in the manner as in the first example. (FIG. 6B)

Figure 6C:
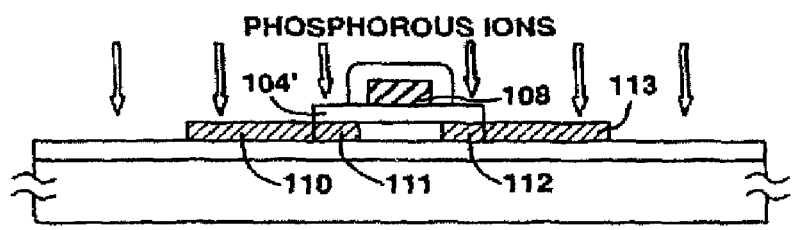

Using the porous anodic oxide 107 as a mask, the silicon oxide film 104 is etched into a gate insulating film 104'. Then, using the barrier type anodic oxide 108 as a mask, the porous anodic oxide 107 is etched off. Subsequently, an impurity element is introduced by ion doping using the gate electrode with the barrier type anodic oxide formed thereon and the gate insulating film used as a mask, thereby, forming low resistivity impurity regions 110 and 113 and high resistivity impurity regions 111 and 112. The dose amount is $1\text{-}5\times10^{14}$ atoms/cm$^2$. The acceleration voltage is 30-90 kV. The impurity element is phosphorous. (FIG. 6C)

Figure 6D:
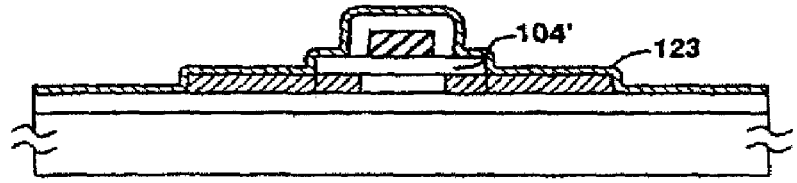

Further, a metal film 123, for example, titanium film of 50-500 Å thick is formed on the entire surface by sputtering. In place of titanium, other metals such as nickel, molybdenum, tungsten, platinum and paradium may be used. As a result, the metal film 123 is formed in direct contact with the low resistivity regions 110 and 113. (FIG. 6D)

Then, a KrF excimer laser (wavelength 248 nm, pulse width 20 nsec) is emitted onto the films in order to activate the introduced impurity and make the metal film react with the silicon of the active layer. Thus, metal silicide regions (titanium silicide) 125 and 126 are formed. The energy density of the laser is 200-400 mJ/cm$^2$, preferably, 250-300 mJ/cm$^2$. Also, the substrate is heated to 200-500° C. during the laser irradiation in order to avoid a peeling of the metal film.

Then, the metal film remaining on the gate electrode and the gate insulating film, without reacting with silicon, is removed by etching with an etchant containing a mixture of hydro peroxide, ammonium and water at a ratio 5:2:2. The metal silicide regions 125 and 126 are thus formed.

Figure 6E:
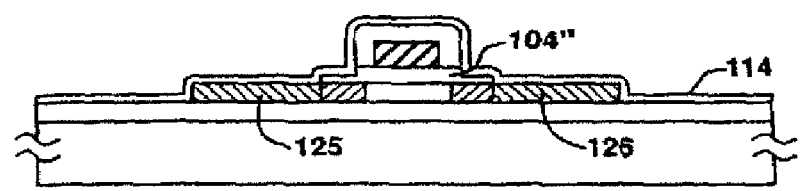

Thereafter, the gate insulating film 104' is etched using the gate electrode portion as a mask to form a new gate insulating film 104" having a thinner portion (200-500 Å thick) as shown in FIG. 6E. Further, a silicon nitride film 114 is formed on the entire surface by plasma CVD to a thickness of 200-2000 Å. Since the high resistivity regions 111 and 112 are covered with the thinner portion of the gate insulating film, a damage caused by the plasma CVD can be avoided.

Thereafter, hydrogen ions are introduced into the active layer by ion doping in the same manner as in the first example.

Figure 6F:
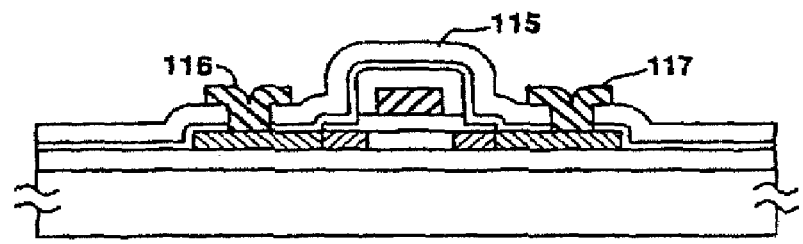

Finally, referring to FIG. 6F, an interlayer insulator 115 of 2000 Å to 1 μm, for example, 3000 Å comprising silicon oxide is formed by CVD. Aluminum electrode or wiring 116 and 117 are formed with a thickness of 2000 Å-1 μm, e.g. 5000 Å, through contact holes formed in the interlayer insulator.

In this example, since the aluminum electrodes 116 and 117 contact a titanium silicide, the interface between the source/drain regions and the electrodes 116 and 117 can be improved and the reliability of the contact can be improved. Also, it is preferable to form a titanium nitride layer between the aluminum electrodes and the titanium silicide as a barrier metal. The sheet resistance of the metal silicide regions is 10-50 Ω/square. The sheet resistance of the high resistivity regions 111 and 112 is 10-500 kΩ/square.

Also, the silicon nitride film 114 formed on the high resistivity regions 111 and 112 through the gate insulating film prevents mobile ions such as sodium from entering from the outside.

Further, the regions 110 and 113 in which the phosphorous impurity is added at a high concentration approximately coincide with the metal silicide regions 125 and 126. Furthermore, each boundary between the low resistivity regions 110 and 113 and the high resistivity regions 111 and 112 is coextensive with the side edges of the gate insulating film 104'. Moreover, the side edges of the gate insulating film 104' are also coextensive with the inner side edges of the metal silicide regions 125 and 126.

Figure 5B:
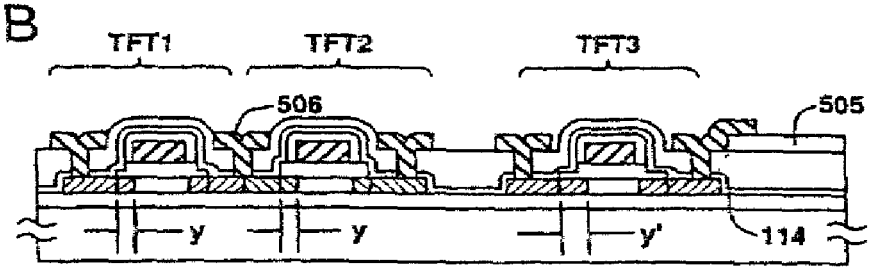

FIG. 5B shows an example of a monolithic circuit using the TFT in accordance with the process shown in FIGS. 6A through 6F. The monolithic circuit of FIG. 5B is used for example as a circuit substrate of an active matrix liquid crystal device where both of pixel TFTs and peripheral circuits formed of TFTs are integrally formed on a same substrate. In the figure, TFTs 1-3 are shown. TFTs 1 and 2 are used as driver TFTs of which barrier type anodic oxide is 200-2000 Å thick, for example, 1000 Å. On the other hand, the TFT 3 is used as a pixel transistor of which barrier type anodic oxide is 1000 Å thick also. The source or drain electrode of TFT 3 is connected to a pixel electrode 505 made of ITO. Reference numeral 506 shows an output terminal of an inverter.

The thickness of the barrier type anodic oxide is so selected that the edge of the gate electrode is aligned with the edge of the source/drain region, considering a diffusion of added impurity. While the width "y" of the high resistivity regions in TFT1 and TFT2 is as thin as 0.2 μm (for example), the width "y'" of the high resistivity regions in TFT 3 is made as thick as 0.4-5 μm, for example, 0.5 μm. In order to change the width of the high resistivity region, the thickness of the porous anodic oxide should be controlled as explained above. For this reason, it is desirable that the gate electrode of each TFT be separated from one another so that the anodic oxide may be performed with respect to each gate electrode of the TFTs, independently. Because the width of the high resistivity regions in TFT 3 is larger, it is possible to reduce a parasitic capacitance occurring between the gate electrode and the drain when applying a voltage.

Also, while the TFTs 1 and 3 are N-channel type, the TFT 2 is P-channel type. Accordingly, the process of the first and second examples is not suitable for the formation of the TFT 2 as explained in the former example.

Also, the formation of the titanium film may be done before the ion doping of the impurity. In this case, it is advantageous that the titanium film prevents the surface from being charged up during the ion doping. Also, it is possible to carry out an annealing with laser or the like after the ion doping step and then form the titanium film. After the titanium forming step, the titanium silicide can be formed by light irradiation or heat annealing.

Example 4

Figure 7A:
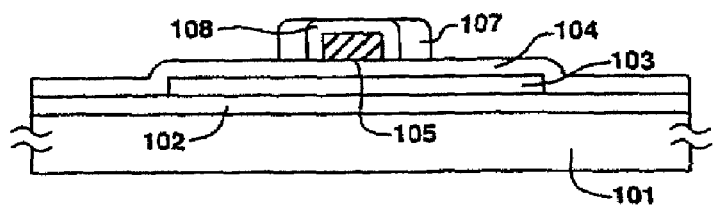
FIGS. 7A to 7F show a manufacturing process of TFT in accordance with the fourth example of the invention.

Referring to FIG. 7A, in the same manner as in the first example, an underlying film comprising silicon oxide 102, a crystalline silicon island 103, a silicon oxide film 104, a gate electrode 105 made of aluminum of 2000 Å-1 μm thick, and a porous anodic oxide film 107 (6000 Å wide) on the side surface of the gate electrode are formed on a Corning 7059 glass substrate 101. Further, a barrier type anodic oxide film 108 is formed in the manner described with reference to the first example.

Figure 7B:
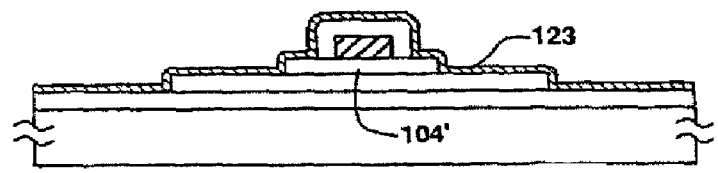

Using the porous anodic oxide 107 as a mask, the silicon oxide film 104 is etched to form a gate insulating film 104'. Then, using the barrier type anodic oxide 108 as a mask, the porous anodic oxide 107 is etched off. Then, a metal film 123 such as titanium is formed on the entire surface to a thickness of 50-500 Å by sputtering. (FIG. 7B)

Figure 7C:
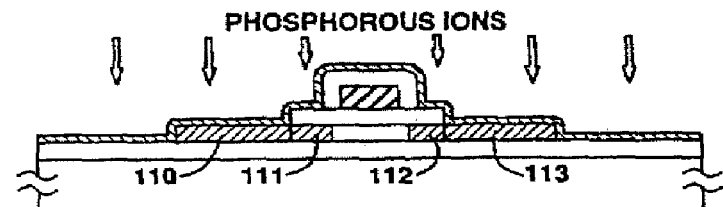

Subsequently, an impurity element is introduced by ion doping. The dose amount is $5 \times 10^{14}$ to $5 \times 10^{15}$ atoms/cm$^2$. The acceleration voltage is 10-30 keV. The impurity element is phosphorous. Because the acceleration voltage is enough small, while the regions 110 and 113 are doped with sufficient amount of impurity, the regions 111 and 112 are doped with the impurity at a lower concentration because of the existence of the gate insulating film. Thus, low resistivity regions (source and drain regions) 110 and 113 and high resistivity regions 111 and 112 are formed. Phosphine (PH$_3$) is used as a doping gas. (FIG. 7C)

Figure 7D:
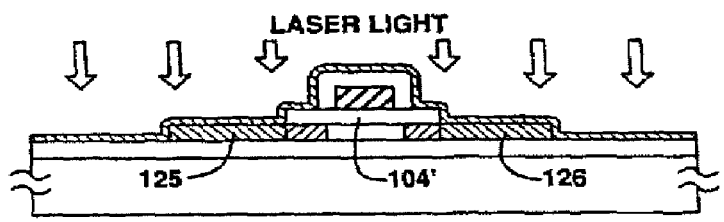

Then, a KrF excimer laser (wavelength 248 nm, pulse width 20 nsec) is emitted onto the films in order to activate the introduced impurity in the regions 111 and 112 and make the titanium film react with the silicon of the active layer. Thus, titanium silicide regions 125 and 126 are formed. The energy density of the laser is 200-400 mJ/cm$^2$, preferably, 250-300 mJ/cm$^2$. Also, it is preferable to heat the substrate to 200-500° C. during the laser irradiation in order to avoid a peeling of the metal film. In place of the laser, a lump annealing with a visible ray or near infrared ray may be used. (FIG. 7D)

Then, the metal film remaining on the gate electrode and the gate insulating film, without reacting with silicon, is removed by etching with an etchant containing a mixture of hydro peroxide, ammonium and water at a ratio 5:2:2. The metal silicide regions 125 and 126 are thus formed.

Figure 7E:
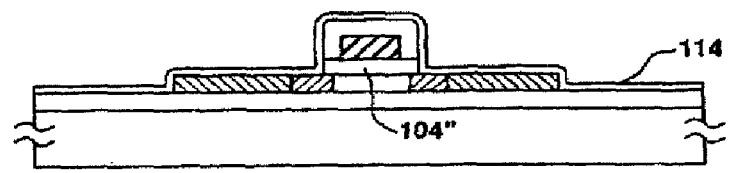

Thereafter, the gate insulating film 104' is patterned by dry etching using the gate electrode portion as a mask to form a new gate insulating film 104" as shown in FIG. 7E. Further, a silicon nitride film 114 is formed on the entire surface by plasma CVD to a thickness of 200-2000 Å.

Figure 7F:
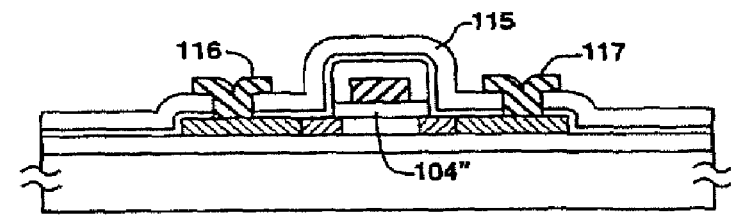

Thereafter, hydrogen ions are introduced into the active layer by ion doping, following which the structure is annealed in a nitrogen atmosphere. Further, an interlayer insulator 115 of for example, 6000 Å comprising silicon oxide is formed by CVD. Aluminum electrode or wiring 116 and 117 are formed through contact holes formed in the interlayer insulator as shown in FIG. 7F. Thus, a TFT having a high resistivity region is completed.

Figure 5C:
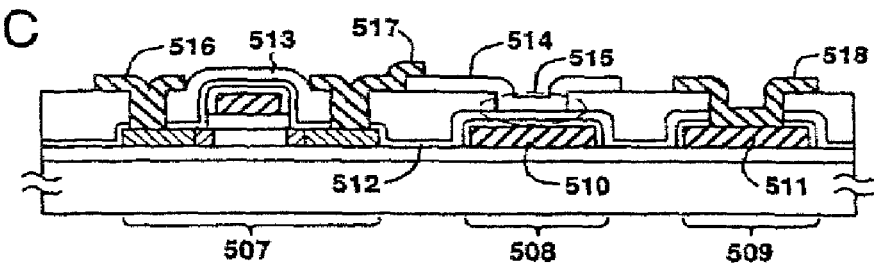

FIG. 5C shows an example in which the TFT in accordance with the fourth example is used in a pixel of an active matrix liquid crystal device. In the figure, a region 507 shows a TFT region, a region 508 shows an auxiliary capacitor for assisting a capacitance of a pixel electrode, a region 509 shows a contact region between first and second wirings. A silicon nitride film 512 covers an active silicon layer of the TFT, a gate electrode, and wirings 510 and 511 formed on the same plane as the gate electrode (which are all provided with an anodic oxide film thereon). Further, an interlayer insulator 513 is formed on the silicon nitride film.

The TFT is provided with a source electrode 516 and a drain electrode 517. The electrode 517 is connected to a pixel electrode 514 of ITO. The interlayer insulator 513 covering the wiring 510 is removed at a region 515. The pixel electrode 514 and the wiring 510 face with each other through the anodic oxide film and the silicon nitride film 512 to form a capacitor. In this case, a large capacitance can be obtained with a small area because the gap between the electrodes is small and the dielectric constants of the silicon nitride and the anodic oxide (aluminum oxide) are large.

Example 5

Figure 8A:
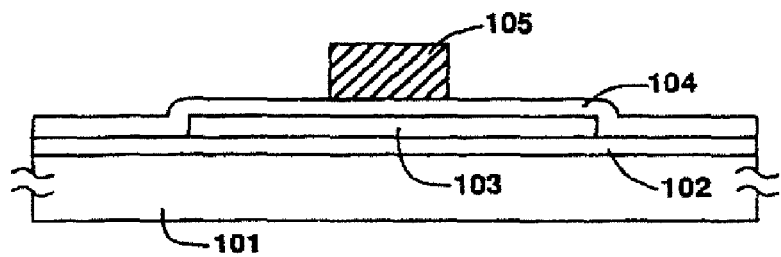
FIGS. 8A to 8F show a manufacturing process of TFT in accordance with the fifth example of the invention.

Referring to FIG. 8A, in the same manner as in the first example, an underlying film comprising silicon oxide 102, a crystalline semiconductor island 103, for example, silicon semiconductor, a silicon oxide film 104, a gate electrode 105 made of aluminum of 2000 Å-1 μm thick are formed on a Corning 7059 glass substrate 101.

Figure 8B:
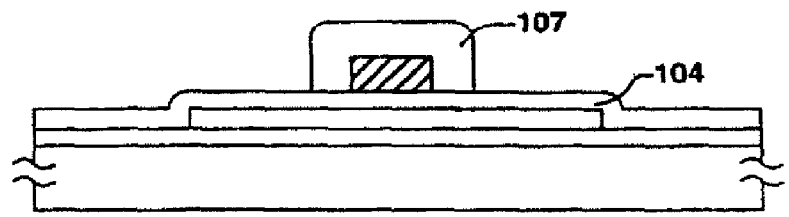

Then, a porous anodic oxide film 107 (6000 Å thick) is formed on the upper and side surfaces of the gate electrode using the same conditions as in the first example. (FIG. 8B)

Figure 8C:
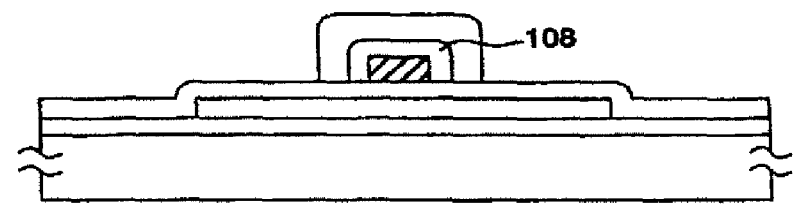

Further, a barrier type anodic oxide film 108 is formed between the gate electrode and the porous anodic oxide. (FIG. 8C)

Figure 8D:
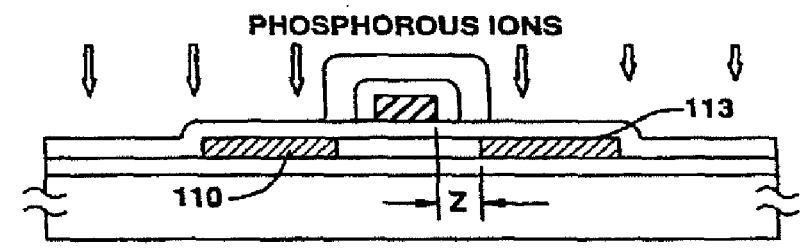

Subsequently, an N-type impurity element is introduced by ion doping using the gate electrode with the barrier type anodic oxide formed thereon used as a mask at a dose of $5 \times 10^{14}$ to $5 \times 10^{15}$ atoms/cm$^3$. The acceleration voltage is 40-100 keV. Phosphine is used as a dopant gas. Accordingly, low resistivity impurity regions 110 and 113 are formed. The channel region extends beyond the side edges of the gate electrode by the distance "z" to form an offset region which is substantially intrinsic. The distance "z" is determined by the width of the porous and barrier type anodic oxides 107 and 108. Thus, high resistivity regions are formed. (FIG. 8D)

Then, the porous type anodic oxide 107 is removed by etching to expose the surface of the barrier type anodic oxide 108.

Then, a KrF excimer laser (wavelength 355 nm, pulse width 40 nsec) is emitted onto the films in order to activate the introduced impurity. The energy density of the laser is 200-400 mJ/cm$^2$, preferably, 250-300 mJ/cm$^2$. Also, the substrate may be heated to 200-500° C. during the laser irradiation in order to avoid a peeling of the metal film. Also, the step may be carried out by lump annealing with visible ray or near infrared ray. Further, a silicon nitride film 114 is formed on the entire surface by plasma CVD to a thickness of 200-2000 Å, for example, 1000 Å

Figure 8E:
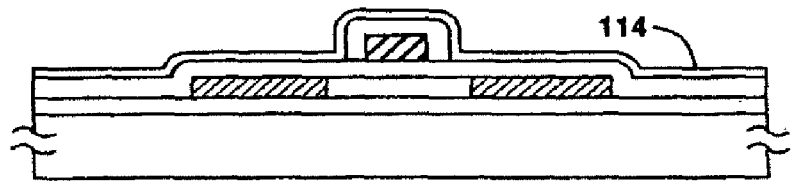

Thereafter, hydrogen ions are introduced into the active layer by ion doping, following which the structure is annealed in a nitrogen atmosphere to activate the hydrogen. (FIG. 8E)

Figure 8F:
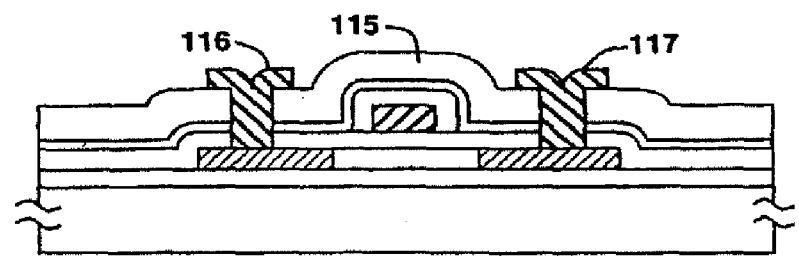

Finally, referring to FIG. 8F, an interlayer insulator 115 of 6000 Å comprising silicon oxide is formed by CVD. Contact holes are formed in the interlayer insulator and electrodes or wirings 116 and 117 made of a multilayer film of titanium nitride and aluminum are formed therethrough Thus, a TFT in accordance with the fourth example of the invention is completed.

Example 6

Figure 9A:
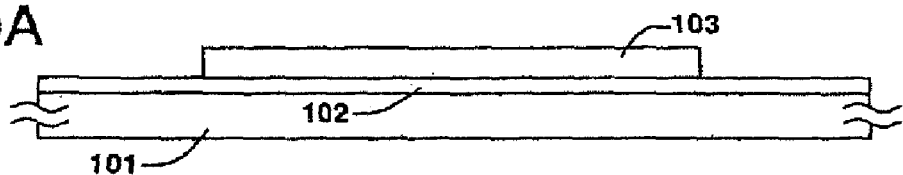
FIGS. 9A to 9G show a manufacturing process of TFT in accordance with the sixth example of the invention.

FIGS. 9A-9F show a manufacturing method of a TFT in accordance with the sixth example of the invention. A silicon oxide film 102 of 3000 Å thick is formed by sputtering or plasma CVD on a glass substrate 101. An amorphous silicon film is formed by plasma CVD or LPCVD on the silicon oxide film 102 to 500 Å thick, following which the silicon film is crystallized by heating or laser irradiation. Then, the silicon film is patterned into an active layer 103 for the insulated gate field effect transistor. Optionally, the amorphous silicon film may be used as the active layer without being crystallized. (FIG. 9A)

Then, a silicon oxide film 104 is formed by plasma CVD or reduced pressure thermal CVD to 1000 Å thick as an interlayer insulator. Further, an aluminum film containing 0.18% scandium therein is formed by electron beam evaporation. Then, the surface of the aluminum film is anodic oxidized to form an oxide layer 127 of as thin as 100 Å in an ethylene glycol solution containing 5% tartaric acid.

Figure 9B:
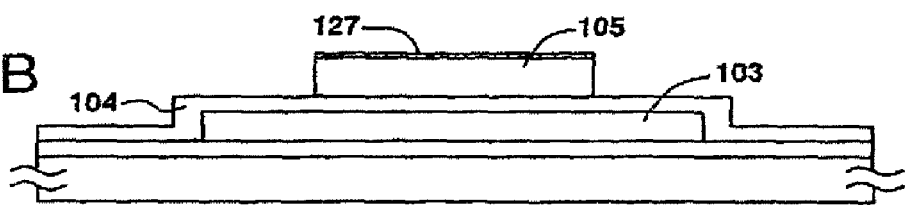

The aluminum film together with the anodic oxide film is patterned into an island form aluminum film 105 to form a gate electrode. (FIG. 9B)

Figure 9C:
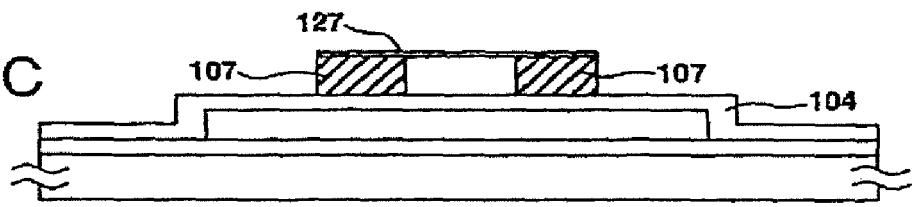

Then, a porous anodic oxide film 107 is formed to a width of 6000 Å by anodic oxidation using a 10% citric acid solution. (FIG. 9C)

Subsequently, the dense oxide film 127 is removed, following which an anodic oxidation is again performed using an ethylene glycol solution containing a tartaric acid at 5% in order to form a barrier type anodic oxide film 108.

Figure 9D:
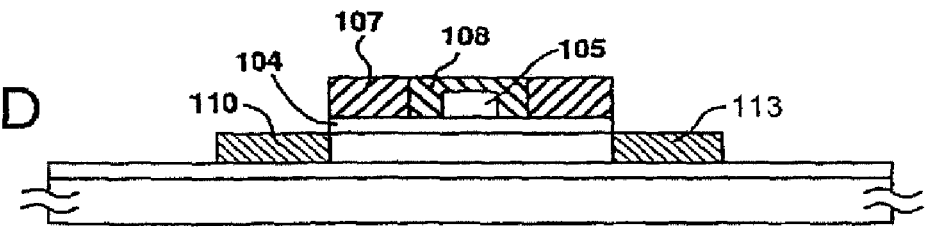

Using the gate electrode 105, the barrier type anodic oxide 108, and the porous anodic oxide 107 as a mask, a portion of the silicon oxide film 104 is etched. (FIG. 9D)

Figure 9E:
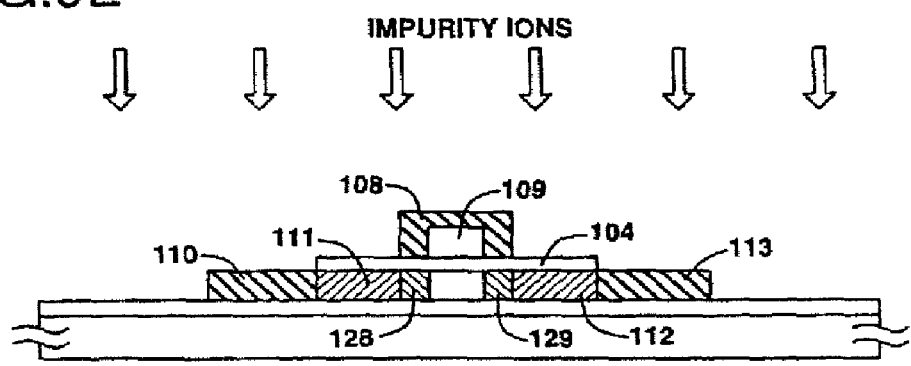

Referring next to FIG. 9E, an N-type impurity element phosphorous is introduced at a dose of $5 \times 10^{14}$ to $5 \times 10^{15}$ atoms/cm$^2$ in order to form source and drain regions 110 and 113. At the same time, lightly doped regions 111 and 112 are formed because of the existence of the silicon oxide film 104 located thereon. Also, offset gate regions 128 and 129 are formed which have the same conductivity type as the channel region, i.e. intrinsic. Thereafter, the added impurity is activated by heat treatment, laser irradiation or a strong light irradiation.

The concentration of the phosphorous in the source and drain regions 110 and 113 are higher than that in the lightly doped regions 111 and 112 by 2-3 digits. For example, the concentration in the source and drain regions is $1 \times 10^{20}$ to $2 \times 10^{21}$ atoms/cm$^3$ while that in the lightly doped regions is $1 \times 10^{17}$ to $2 \times 10^{21}$ atoms/cm$^3$.

Figure 9F:
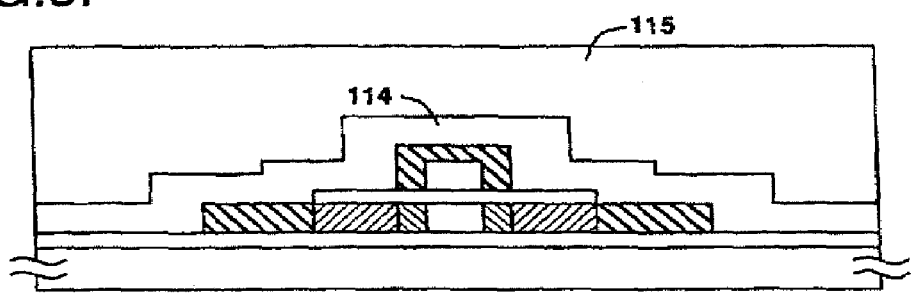
Figure 9G:
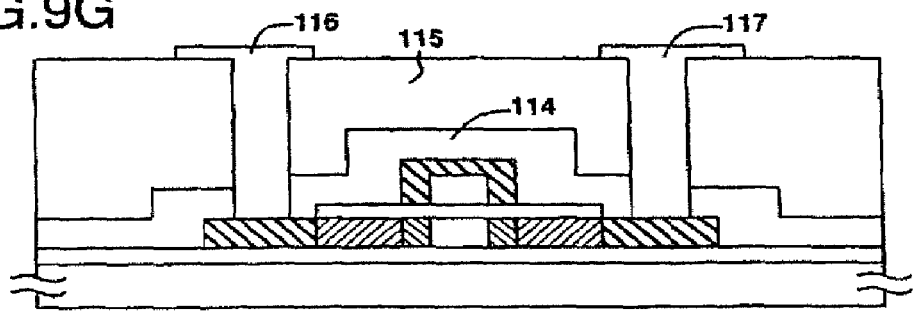

Referring to FIG. 9F, a silicon nitride film 114 is further formed on the entire surface. As a method for the formation of the silicon nitride film, a plasma CVD may be used. However, a photo CVD or thermal CVD may be used to improve the surface condition. Also, as a starting material, silane and ammonium, silane and N$_2$O, or a combination thereof may be used. Dichlorosilane may be used instead of silane. The thickness of the silicon nitride film 114 is 500-2000 Å, for example, 1000 Å

After the formation of the silicon nitride film, the laminated structure is treated with a heat annealing of 350° C. for 2 hours in order to cure damages caused to the silicon oxide gate insulating film 104, source and drain regions 110 and 113 by the impurity adding step. During the heat annealing, the hydrogen contained in the silicon nitride film diffuses so that defects existing on the surface of the silicon oxide film 104 and the source and drain regions 110 and 113 can be annealed.

Then, an interlayer insulating film 115 is formed by depositing silicon oxide to 5000 Å thick or larger, through a plasma CVD using TEOS as a starting gas. It should be noted that the silicon oxide film formed from TEOS tends to trap electrons therein. However, the silicon nitride film 114 traps positive charges therein and thus neutralize the electrons. Accordingly, the formation of the silicon nitride film adjacent to a silicon oxide film formed from TEOS is especially advantageous.

Example 7

Figure 10:
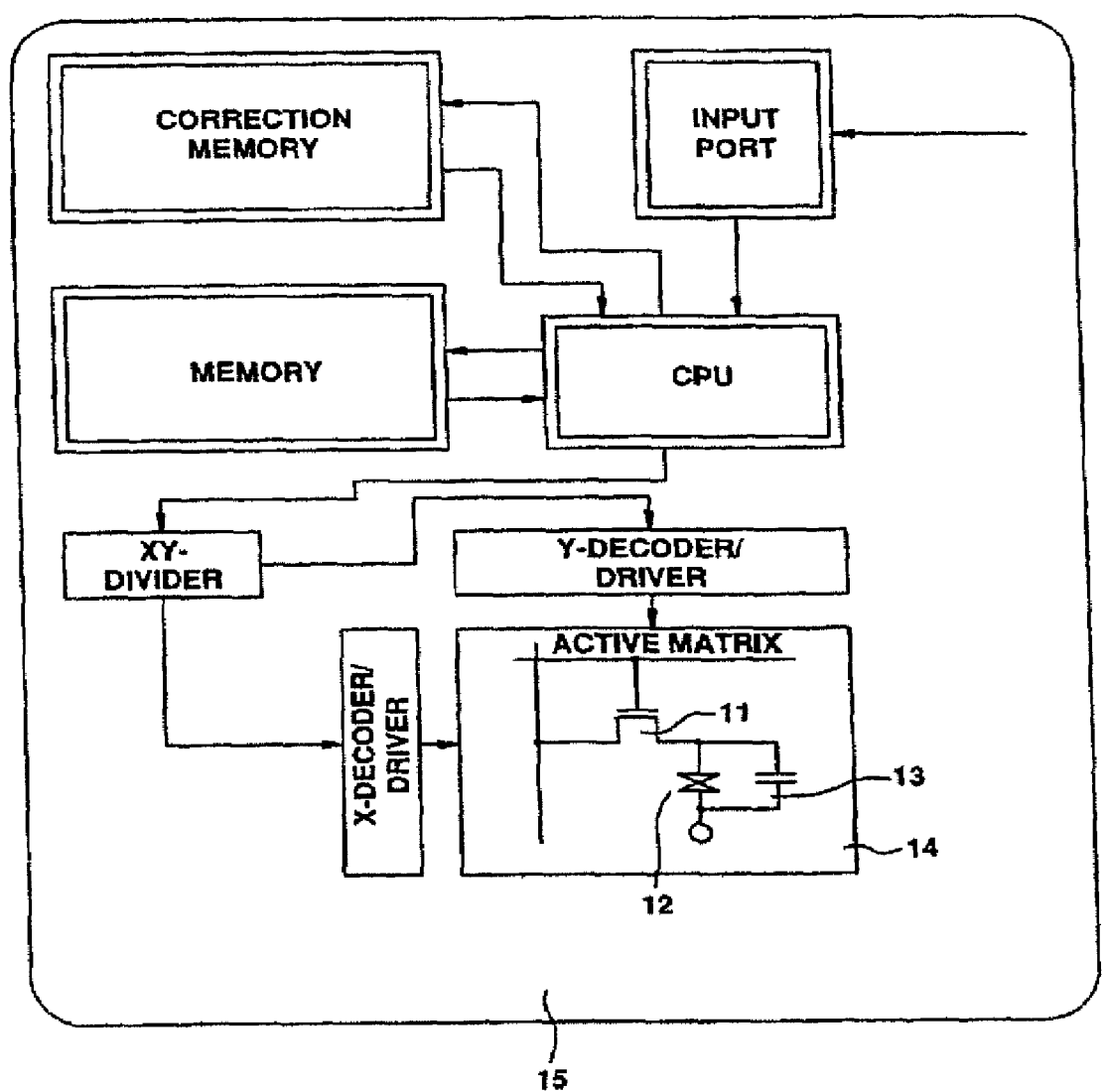
FIG. 10 is a schematic diagram showing a liquid crystal device in accordance with the present invention.

The seventh example of this invention is directed to a liquid crystal device using TFTs manufactured in accordance with the present invention to form a circuit substrate. FIG. 10 shows a diagram of a liquid crystal device having a pair of substrates between which a liquid crystal is interposed, one of which is provided with a semiconductor chip which is usually mounted on a main board of a computer. Thereby, the unit can be compact, light weight and thin.

In the drawing, the reference numeral 15 shows a substrate of the liquid crystal cell. On the substrate 15, an active matrix circuit 14 is formed which comprises a number of pixels, each of which comprises a TFT 11, pixel electrode 12 and an auxiliary capacitor 13. Also, an X-decoder/driver, Y-decoder/driver and XY-divider are formed of TFTs on the substrate to drive the pixels. Of course, it is possible to use the TFTs described in the previous examples. Further, semiconductor chips are formed on the substrate through wiring bonding method or COG (chip-on-glass) method. In the drawing, a correction memory, memory, CPU and input port are constituted by these chips. Other chips may also be formed.

The input port is to read a signal input from outside and to convert it into a display signal. The correction memory is to correct the input signal or the like for each pixel depending upon the specific characteristics of the active matrix panel. In particular, the correction memory comprises a non-volatile memory storing specific information of each pixel of the panel. For example, when there is a point defect in one pixel of an electro-optical device, the pixels around the defect are supplied with corrected signals so that the defect appears less. Also, when the brightness in one pixel is lower than others, a stronger signal is sent to the pixel in order to compensate the brightness. Since the defect information of pixels are different in each panel, the information stored in the correction memory is different in each panel.

The CPU and the memory have the same functions as those used in a conventional computer. In particular, the memory comprises a RAM having a display memory in correspondence with each pixel. These chips are all CMOS types.

Also, a part of the foregoing chips may be constituted by TFTs of the present invention. The liquid crystal substrate of the present example has a CPU and a memory mounted thereon, which is comparable with a simple electronic device like a personal computer. This is very advantageous for compacting the liquid crystal display system and extending the application thereof.

The pixel TFT 11 may be formed in the following manner.

Figure 11A:
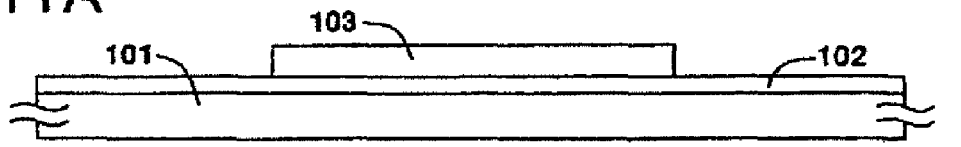
FIGS. 11A to 11D show a manufacturing process of TFT in accordance with the seventh example of the invention.

Referring to FIG. 11A, a base silicon oxide film 102 is formed by sputtering on a glass substrate 101. Then, an amorphous silicon film is formed through plasma CVD or low pressure thermal CVD to a thickness of 500 Å. The amorphous silicon film is crystallized by heating or laser irradiation, following which the film is patterned into an active layer 103.

Figure 11B:
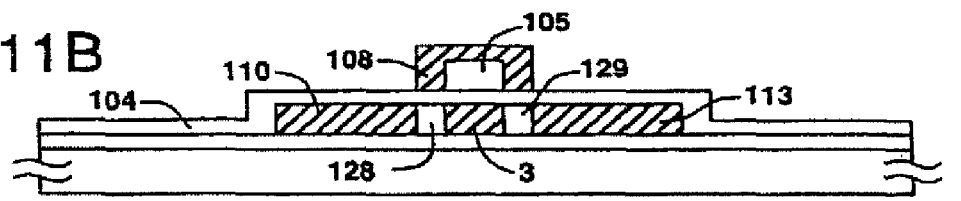

Referring to FIG. 11B, a silicon oxide film 104 is formed to a thickness of 1000 Å as a gate insulating film through a plasma CVD or sputtering. Further, a gate electrode 105 is formed by depositing an aluminum film containing scandium at 0.18 weight % to a thickness of 6000 Å and patterning it. Then, the aluminum gate electrode 105 is subjected to an anodic oxidation in an ethylene glycol solution containing 5% tartaric acid, thereby, forming a dense anodic oxide film 108 to a thickness of 2000 Å

Using the gate electrode and the anodic oxide film 108 as a mask, phosphorous ions, an N-type impurity is introduced by plasma doping into a portion of the active layer 103 to form source and drain regions 110 and 113. Because of the existence of the anodic oxide film 108, there is formed a pair of offset regions 128 and 129 between the channel region 3 and each of the source and drain regions 110 and 113. After the doping of the phosphorous ions, the source and drain regions are activated by a heat treatment or a laser or intense light irradiation.

Figure 11C:
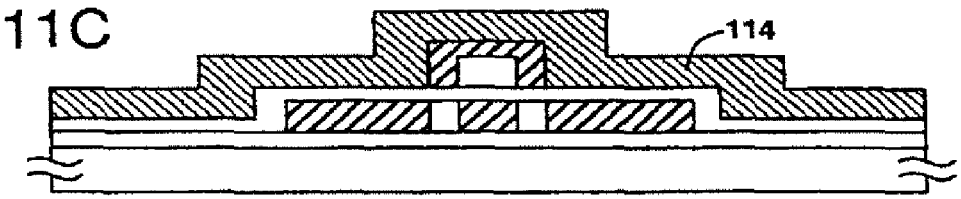

Referring to FIG. 11C, a silicon nitride film 114 is formed by a plasma CVD using silane and ammonium to a thickness of 1000 Å. Subsequently, the entire structure is heated at 300-500° C., for example, 450° C. in an inert atmosphere. The heating is continued for 1 hour. By this heating, hydrogen atoms contained in the silicon nitride film diffuse into the silicon oxide film 104 and cure the defects caused to the silicon oxide film due to the phosphorous doping step.

Figure 11D:
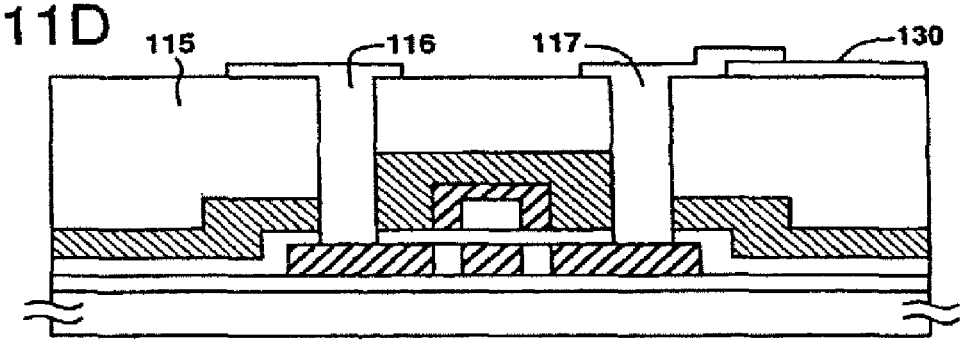

Further, a silicon oxide film 115 is formed to a thickness of 5000 Å by a plasma CVD using TEOS and oxygen as a starting gas. The substrate temperature is 300-550° C. during the plasma CVD. Contact holes are formed through the silicon oxide film 115 and source and drain electrodes 116 and 117 are formed therethrough as shown in FIG. 11D. The drain electrode 117 is connected to a pixel electrode 130 made of ITO.

The high resistivity regions of an N channel TFT in accordance with the present invention may be either one of an N-type conductivity region, a C, N or O doped region or an offset gate region. Further, two or more of them may be combined. In any event, because of the existence of the film capable of trapping positive charges adjacent to the high resistivity region either in direct contact therewith or through a silicon oxide film therebetween, it is possible to avoid an occurrence of a parasitic channel in the high resistivity regions. In particular, the present invention is effective to avoid a decrease in mobility when a drain voltage is several volts. For this reason, when using the N channel TFT as a pixel transistor of a liquid crystal device, it is possible to control delicate voltages and to reproduce an image having delicate gray scales.

Also, the TFTs of the present invention are applicable for TFTs in a three dimensional IC where the TFTs are formed on a substrate formed with an integrated circuit. The TFTs of the present invention may also be formed on a glass or resinous substrate. In any event, the TFTs of the present invention are to be formed on an insulating surface.

It is particularly advantageous when the TFTs of the present invention are used as TFTs of an electro-optical device such as a monolithic type active matrix circuit having a peripheral circuit on a same substrate, because the TFTs of the present invention are low in a leak current (Ioff current), are capable of being driven with a higher voltage and have a higher reliability, which are required for pixel TFTs of an active matrix circuit.

In place of silicon oxide as a gate insulating film, it is possible to use other materials such as silicon nitride, silicon oxinitride (SiON). Also, a multi-layer of these materials may be used.

Further, the silicon nitride film used in the present invention may have a multi-layer structure. For example, the film comprises first and third silicon nitride layers in which the ratio Si:N is approximately 3:4, and a second silicon nitride layer interposed between the first and third layers. The ratio Si:N in the second film is 10:1 to 10:5. Also, the thickness of the first layer is in the range of 10-100 Å, for example, 50 Å, the second layer is 20-200 Å, e.g. 100 Å and the third layer is 100-5000 Å, e.g. 500 Å. This structure can be formed by changing the flow rate of the nitrogen containing gas with respect to the silicon containing gas during the deposition.

While various examples have been disclosed with respect the preferred embodiment of the invention, it is to be understood that the present invention should not be limited to those particular examples, but many modifications may be made by those ordinary skilled person without departing the scope of the attached claims.

What is claimed is:

1. A semiconductor device comprising:
   a single crystalline semiconductor island on an insulating surface, the single crystalline semiconductor island comprising a source region, a drain region, and a channel region located between the source region and the drain region;
   a gate electrode over the channel region with an insulating layer interposed therebetween;
   an impurity region having a lower impurity concentration than the source region and the drain region, the impurity region being located between the channel region and at least one of the source region and the drain region; and
   a silicon nitride film over the gate electrode and the single crystalline semiconductor island,
   wherein each of the source region and the drain region comprises a metal silicide region, and the silicon nitride film is in contact with an upper surface of the metal silicide region.

2. The semiconductor device according to claim 1 wherein each of the source region and the drain region is approximately coincide with the metal silicide region.

3. The semiconductor device according to claim 1 wherein the gate electrode is made of a metal.

4. The semiconductor device according to claim 1 wherein the metal silicide region is a silicide of a metal selected from the group consisting of titanium, nickel, molybdenum, tungsten, platinum and palladium.

5. The semiconductor device according to claim 1 wherein a sheet resistance of the metal silicide region is 10-50 Ω/square and a sheet resistance of the impurity region is 10-500 kΩ/square.

6. The semiconductor device according to claim 1 wherein the silicon nitride film is 200-2000 Å thick.

7. The semiconductor device according to claim 1 wherein the insulating surface is a surface of a silicon oxide film formed on a silicon wafer.

8. A semiconductor device comprising:
   a single crystalline semiconductor island on an insulating surface, the single crystalline semiconductor island comprising a source region, a drain region, and a channel region located between the source region and the drain region;
   a gate electrode over the channel region;
   an impurity region having a lower impurity concentration than the source region and the drain region, the impurity region being located between the channel region and at least one of the source region and the drain region;
   an insulating film comprising silicon oxide on and in contact with the impurity region; and
   a silicon nitride film over the gate electrode and the single crystalline semiconductor island,
   wherein each of the source region and the drain region comprises a metal silicide region, and the silicon nitride film is in contact with an upper surface of the metal silicide region.

9. The semiconductor device according to claim 8 wherein the metal silicide region is a silicide of a metal selected from the group consisting of titanium, nickel, molybdenum, tungsten, platinum and palladium.

10. The semiconductor device according to claim 8 wherein a sheet resistance of the metal silicide region is 10-50 Ω/square and a sheet resistance of the impurity region is 10-500 kΩ/square.

11. The semiconductor device according to claim 8 wherein the silicon nitride film is 200-2000 Å thick.

12. The semiconductor device according to claim 8 wherein the insulating surface is a surface of a silicon oxide film formed on a silicon wafer.

13. A semiconductor device comprising:
   a single crystalline semiconductor island on an insulating surface, the single crystalline semiconductor island comprising a source region, a drain region, and a channel region located between the source region and the drain region;
   a gate electrode over the channel region with an insulating layer interposed therebetween;
   an impurity region having a lower impurity concentration than the source region and the drain region, the impurity region being located between the channel region and at least one of the source region and the drain region;
   a silicon nitride film over the gate electrode and the single crystalline semiconductor island; and
   an interlayer insulating film comprising silicon oxide over the silicon nitride film,
   wherein each of the source region and the drain region comprises a metal silicide region, and the silicon nitride film is in contact with an upper surface of the metal silicide region.

14. The semiconductor device according to claim 13 wherein the metal silicide region is a silicide of a metal selected from the group consisting of titanium, nickel, molybdenum, tungsten, platinum and palladium.

15. The semiconductor device according to claim 13 wherein a sheet resistance of the metal silicide region is 10-50 Ω/square and a sheet resistance of the impurity region is 10-500 kΩ/square.

16. The semiconductor device according to claim 13 wherein the silicon nitride film is 200-2000 Å thick.

17. The semiconductor device according to claim 13 wherein the insulating surface is a surface of a silicon oxide film formed on a silicon wafer.

18. A semiconductor device comprising:
   a single crystalline semiconductor island on an insulating surface, the single crystalline semiconductor island comprising a source region, a drain region, and a channel region located between the source region and the drain region;
   a gate electrode over the channel region with an insulating layer interposed therebetween;
   an impurity region having a lower impurity concentration than the source region and the drain region, the impurity region being located between the channel region and at least one of the source region and the drain region; and
   a silicon nitride film over the gate electrode and the single crystalline semiconductor island,
   wherein each of the source region and the drain region comprises a nickel silicide region, and the silicon nitride film is in contact with an upper surface of the nickel silicide region.

19. The semiconductor device according to claim 18 wherein each of the source region and the drain region is approximately coincide with the nickel silicide region.

20. The semiconductor device according to claim 18 wherein the gate electrode is made of a metal.

21. The semiconductor device according to claim 18 wherein the silicon nitride film is 200-2000 Å thick.

22. The semiconductor device according to claim 18 wherein the insulating surface is a surface of a silicon oxide film formed on a silicon wafer.

23. A semiconductor device comprising:
   a single crystalline semiconductor island on an insulating surface, the single crystalline semiconductor island comprising a source region, a drain region, and a channel region located between the source region and the drain region;

a gate electrode over the channel region;

an impurity region having a lower impurity concentration than the source region and the drain region, the impurity region being located between the channel region and at least one of the source region and the drain region;

an insulating film comprising silicon oxide on and in contact with the impurity region; and a silicon nitride film over the gate electrode and the single crystalline semiconductor island, wherein each of the source region and the drain region comprises a nickel silicide region, and the silicon nitride film is in contact with an upper surface of the nickel silicide region.

wherein the gate electrode is located over the channel region with the insulating film interposed therebetween.

24. The semiconductor device according to claim 23 wherein the silicon nitride film is 200-2000 Å thick.

25. The semiconductor device according to claim 23 wherein the insulating surface is a surface of a silicon oxide film formed on a silicon wafer.

26. A semiconductor device comprising:

a single crystalline semiconductor island on an insulating surface, the single crystalline semiconductor island comprising a source region, a drain region, and a channel region located between the source region and the drain region;

a gate electrode over the channel region with an insulating layer interposed therebetween;

an impurity region having a lower impurity concentration than the source region and the drain region, the impurity region being located between the channel region and at least one of the source region and the drain region;

a silicon nitride film over the gate electrode and the single crystalline semiconductor island; and an interlayer insulating film comprising silicon oxide over the silicon nitride film, wherein each of the source region and the drain region comprises a nickel silicide region, and the silicon nitride film is in contact with an upper surface of the nickel silicide region.

27. The semiconductor device according to claim 26 wherein the silicon nitride film is 200-2000 Å thick.

28. The semiconductor device according to claim 26 wherein the insulating surface is a surface of a silicon oxide film formed on a silicon wafer.

* * * * *